(12) United States Patent
Ono et al.

(10) Patent No.: US 10,049,622 B2
(45) Date of Patent: Aug. 14, 2018

(54) DISPLAY DEVICE AND METHOD FOR DRIVING DISPLAY DEVICE

(71) Applicant: JOLED INC., Tokyo (JP)

(72) Inventors: Shinya Ono, Osaka (JP); Shigeo Homura, Tokyo (JP)

(73) Assignee: JOLED INC., Tokyo (JP)

( * ) Notice: Subject to any disclaimer, the term of this patent is extended or adjusted under 35 U.S.C. 154(b) by 21 days.

(21) Appl. No.: 15/514,843

(22) PCT Filed: Sep. 24, 2015

(86) PCT No.: PCT/JP2015/004845
§ 371 (c)(1),
(2) Date: Mar. 28, 2017

(87) PCT Pub. No.: WO2016/051735
PCT Pub. Date: Apr. 7, 2016

(65) Prior Publication Data
US 2017/0243546 A1 Aug. 24, 2017

(30) Foreign Application Priority Data

Sep. 29, 2014 (JP) ................. 2014-199258
Sep. 29, 2014 (JP) ................. 2014-199322

(51) Int. Cl.
*G09G 3/3266* (2016.01)
*G09G 3/3291* (2016.01)

(52) U.S. Cl.
CPC ......... *G09G 3/3291* (2013.01); *G09G 3/3266* (2013.01); *G09G 2300/043* (2013.01); *G09G 2320/043* (2013.01)

(58) Field of Classification Search
None
See application file for complete search history.

(56) References Cited

U.S. PATENT DOCUMENTS

2002/0158835 A1 10/2002 Kobayashi et al.
2013/0335374 A1* 12/2013 Sugita ................. G06F 3/0412
345/174

FOREIGN PATENT DOCUMENTS

JP 2002-318556 10/2002

OTHER PUBLICATIONS

International Search Report (ISR) in International Pat. Appl. No. PCT/JP2015/004845, dated Dec. 22, 2015.

* cited by examiner

*Primary Examiner* — Patrick Moon
(74) *Attorney, Agent, or Firm* — Greenblum & Bernstein, P.L.C.

(57) ABSTRACT

A method for driving a display device that includes a display unit and is driven by a sequence of row-by-row sequential scanning that includes a vertical blanking period, the display unit having pixels arranged in rows and columns, each pixel including an anode formed on a drive circuit layer, an organic light emitting layer formed above the anode and including a light emitting substance, and a transparent cathode formed above the organic light emitting layer, the method includes initializing a circuit element, writing a signal voltage to a capacitive element, inserting a black display to display the black display during a period determined based on a resistance value of the transparent cathode, and causing the organic EL element to emit light.

19 Claims, 13 Drawing Sheets

FIG. 7

| | | Fluctuations of vcat and drive timing (ta, tb) |
|---|---|---|
| Upper zone of panel | Light (uppermost row) | +Vgs (Rightward decrease)<br>b, c-h<br>Initialization completion time ta, Write completion time tb |
| | Dark (row located predetermined number of rows downward) | −Vgs (Rightward increase)<br>b, c-h<br>Initialization completion time ta, Write completion time tb |
| Lower zone of panel | Dark (row located predetermined number of rows upward) | −Vgs (Rightward increase)<br>b, c-h<br>Initialization completion time ta, Write completion time tb |
| | Light (rowermost row) | +Vgs (Rightward decrease)<br>b, c-h<br>Initialization completion time ta, Write completion time tb |

Driving method of embodiment

Conventional driving method

Upper dark zone of panel

Lower dark zone of panel

DISPLAY DEVICE AND METHOD FOR DRIVING DISPLAY DEVICE

TECHNICAL FIELD

The present disclosure relates to a display device and a method for driving a display device.

BACKGROUND ART

Attention has recently been placed on display devices such as active matrix display devices using organic electroluminescent elements (hereinafter, referred to as "organic EL elements") that are self-luminous and have wide viewing angles and quick responsiveness.

The display devices are configured by a display panel in which organic EL elements are disposed, and a drive circuit for driving the organic EL elements. The display panel is configured by disposing the organic EL elements in a matrix on a substrate such as glass, the organic EL elements including a first electrode such as aluminum (Al), a second electrode such as indium tin oxide (ITO) that opposes the first electrode, and a light emitting layer provided between the first electrode and the second electrode. The drive circuit is configured by, for example, thin-film transistors (TFTs) that are provided between the substrate and the first electrode and individually drive the organic EL elements.

The bottom emission method in which light emitted from the organic EL elements is extracted through the substrate to the outside, and the top emission method in which the light is extracted from the side of the second electrode that opposes the substrate are known as light emitting methods used in the display devices. Display devices using the bottom emission method have difficulty in ensuring a sufficient aperture ratio because of the presence of the thin-film transistors of the drive circuit on the substrate. On the other hand, the top emission method improves the efficiency of use of emitted light, as compared with the bottom emission method, because the aperture ratio is not restricted by factors such as the presence of the thin-film transistors.

The top emission method requires high optical permeability of the second electrode as well as high conductivity, because light is extracted through the second electrode formed on the upper surface of the light emitting layer to the outside. However, a transparent conductive material that is generally used for the second electrode is a metal oxide such as ITO or a metal thin film such as magnesium or aluminum, which has higher resistivity than metal layers used for wiring and other components. Thus, the larger is the display panel, the greater the difference in the wire length of the second electrode will be between light emitting pixels. This causes a large voltage drop between the edge of a power supply unit and the center of the panel and accordingly produces a difference in luminance and make the center of the panel dark. That is, there is a problem in that the unevenness in luminance depending on the positions of the organic EL elements arranged on the display panel surface causes unevenness in display.

To avoid this problem, it is effective to adopt a structure in which the second electrode provided in the upper part as a transparent electrode is connected to low-resistance wiring provided in the lower part. A display device disclosed in Patent Literature (PTL) 1 includes a first electrode that is provided separately from auxiliary wiring on a substrate, the first electrode and the auxiliary wiring being made of conductive materials having low resistivity, a light modulating layer that is provided on the first electrode and serves as a light emitting layer, and a second electrode that is made of a transparent conductive material and provided on the light modulating layer. The auxiliary wiring and the second electrode are connected to each other through openings formed in parts of a dividing wall.

CITATION LIST

Patent Literature

[PTL 1] Japanese Unexamined Patent Application Publication No. 2002-318556

SUMMARY OF INVENTION

Technical Problem

The display device described in PTL 1, however needs to have an arrangement in which the light emitting layer and a functional layer provided between the light emitting layer and the second electrode are formed only on the first electrode and not on the auxiliary electrode in order to establish direct connection between the auxiliary electrode and the second electrode. Techniques for uniformly depositing the light emitting layer and the functional layer are becoming sophisticated as the screen size and the resolution increase. In particular, in order to form the functional layer in sections for each high-resolution pixel, it is necessary to form a high-precision mask for film disposition and to perform an alignment step of aligning the mask and a TFT substrate with high precision. This complicates the manufacturing process.

The present invention has been made to solve the above problem, and it is an object of the present invention to provide a display device and a method for driving a display device that will reduce unevenness in display without complicating the manufacturing process.

Solution to Problem

To achieve the stated object, a method for driving a display device according to an embodiment of the present invention is a method for driving a display device that includes a display unit and is driven by a sequence of row-by-row sequential scanning that includes a vertical blanking period, the display unit having pixels arranged in rows and columns, each of the pixels including a first electrode formed on a drive circuit substrate on which a circuit element is formed, a light emitting layer formed above the first electrode and including a light emitting substance, and a second electrode formed above the light emitting layer. The method includes initializing a light emitting element and the circuit element, writing a signal voltage to the circuit element after the initializing, inserting, after the writing, a black display to display the black display without causing the light emitting element to emit light during a first period that is determined based on a resistance value of the second electrode, and causing the light emitting element to emit light after the inserting.

A method for driving a display device according to another embodiment of the present invention is a method for driving a display device that includes a display unit and is driven by a sequence of row-by-row sequential scanning that includes a vertical blanking period, the display unit having pixels arranged in rows and columns, each of the pixels including a first electrode formed on a drive circuit substrate on which a circuit element is formed, a light emitting layer formed above the first electrode and including a light emitting substance, and a second electrode formed above the light emitting layer. The method includes initializing a light emitting element and the circuit element during a second period that is determined based on a resistance value of the second electrode, writing a signal voltage to the circuit element after the initializing, and causing the light emitting element to emit light after the writing.

Advantageous Effects of Invention

The display device or the method for driving a display device according to the present invention will suppress unevenness in display such as lightness and darkness in the upper and lower edge portions of the panel because the timing of light emission in the uppermost row or the timing of initialization in the lowermost row coincides with the timing of writing in a pixel row located inside the panel where fluctuations of the cathode potential are attenuated.

BRIEF DESCRIPTION OF DRAWINGS

FIG. 7 illustrates the relationship between a cathode potential and Vgs in upper and lower edge portions of the display panel.

DESCRIPTION OF EMBODIMENTS

[Findings Forming Basis of Present Invention]

The inventors of the present invention have found the following problems with the display devices described in the "Background Art."

The display device described in PTL 1 needs tip have an arrangement in which the light emitting layer and the functional layer provided between the light emitting layer and the second electrode are formed only on the first electrode and not on the auxiliary electrode in order to establish direct connection between the auxiliary electrode and the second electrode. Techniques for uniformly depositing the light emitting layer and the functional layer are becoming sophisticated as the screen size and the resolution increase. In particular, in order to form the functional layer in sections for each high-resolution pixel, it is necessary to form a high-precision mask for film disposition and to perform an alignment step of aligning the mask and a TFT substrate with high precision. This complicates the manufacturing process. The following configuration is given as an example of the configuration that provides connection between the auxiliary electrode and the second electrode while simplifying the manufacturing process.

[1-1. Configuration for Reducing Voltage Drop]

Figure 1:
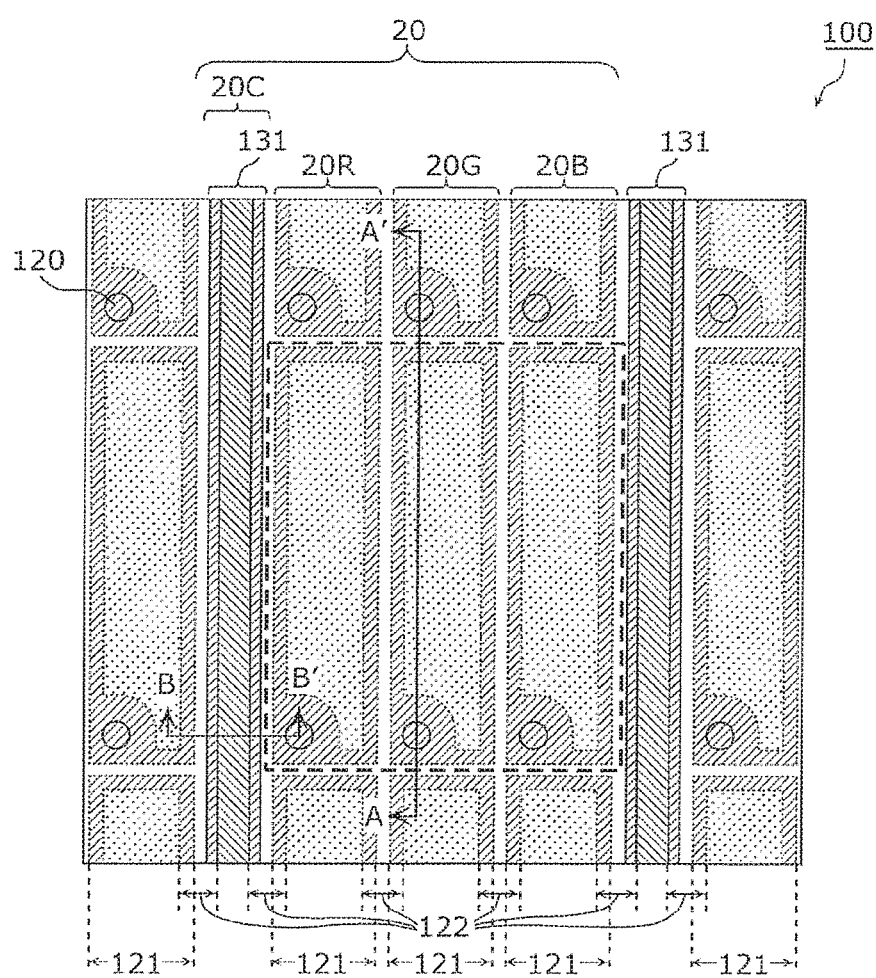
FIG. 1 is a partial plan view of a display device in which auxiliary electrodes are arranged.
Figure 2:
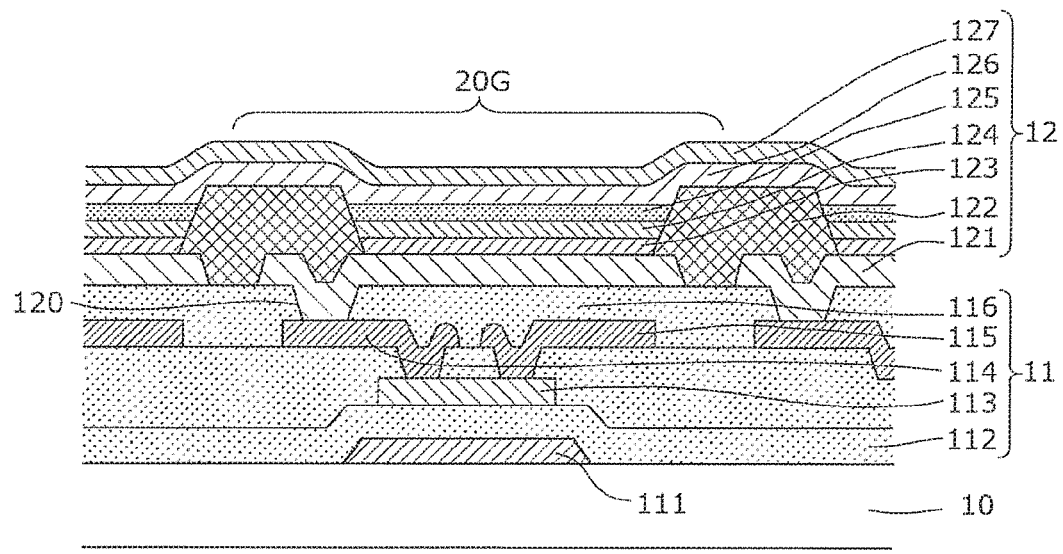
FIG. 2 is a cross-sectional view of an essential part taken along line A-A' in FIG. 1.
Figure 3:
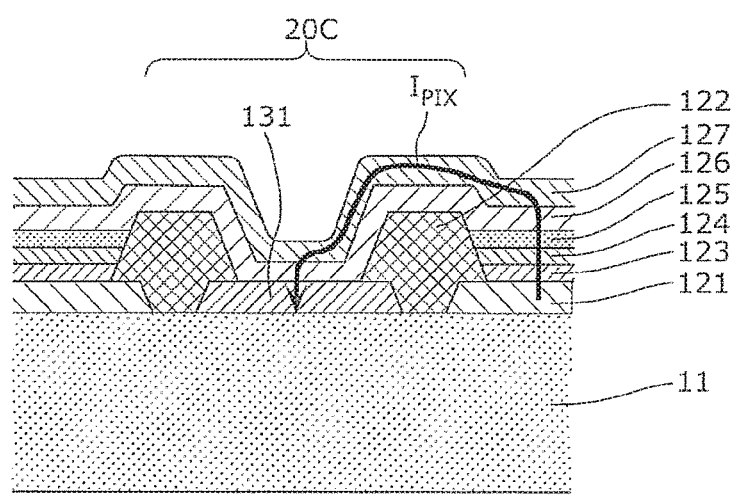
FIG. 3 is a cross-sectional view of an essential part taken along line B-B' in FIG. 1.

FIG. 1 is a partial plan view of a display device in which auxiliary electrodes are arranged. FIG. 2 is a cross-sectional view of an essential part taken along line A-A' in FIG. 1, and FIG. 3 is a cross-sectional view of an essential part taken along line B-B' in FIG. 1. FIG. 1 illustrates part of a display unit that includes one pixel 20. The pixel 20 includes, for example, a sub-pixel 20R for red color display, a sub-pixel 20G for green color display, a sub-pixel 20B for blue color display, and a connection unit 20C as illustrated in FIG. 1. FIG. 1 also illustrates anodes 121 that are disposed for each sub-pixel and spaced from one another, banks 122 that are disposed for each sub-pixel column to section the sub-pixels, auxiliary lines 131 that are disposed for each pixel 20, and via holes 120 that electrically connect a drive circuit layer and the anodes 121.

The following describes a stacked structure of the pixel 20 with reference to FIGS. 2 and 3. The sub-pixel 20G includes a substrate 10, a drive circuit layer 11 provided on the substrate 10, and an organic EL layer 12 provided on the drive circuit layer 11 as illustrated in FIG. 2.

The substrate 10 may be a glass substrate or a quartz substrate. In the case of adopting the top emission method, the substrate 10 may be an opaque plastic substrate or a ceramic substrate.

The drive circuit layer 11 is a layer that includes a circuit element for driving light emission of an organic EL element, and one example of the circuit element is a thin-film transistor (hereinafter, referred to as a "TFT"). The drive circuit layer 11 includes, for example, a gate electrode 111, a gate insulating layer 112, a semiconductor layer 113, a source electrode 114, a drain electrode 115, an interlayer insulating layer 116, and a via hole 120.

The organic EL layer 12 includes an anode 121, a bank 122, a hole injection layer 123, a hole transfer layer 124, an organic light emitting layer 125, an electron transfer layer 126, and a transparent cathode 127.

The anode 121 is a first electrode that is formed on the interlayer insulating layer 116 and alienated on a sub-pixel basis.

The anode 121 is integrally formed with the via hole 120 for connection with the source electrode 114 of the driving transistor.

The bank 122 is a dividing wall that is disposed for each sub-pixel column to section the sub-pixels.

The hole injection layer 123 is formed on the anode 121 and alienated by the bank 122 on a sub-pixel basis.

The hole transfer layer 124 is formed on the hole injection layer 123 and alienated by the bank 122 on a sub-pixel basis. The hole transfer layer 124 has a function of transferring holes injected from the hole injection layer 123 into the organic light emitting layer 125.

The organic light emitting layer 125 is formed on the hole transfer layer 124 and alienated by the bank 122 on a sub-pixel basis. The organic light emitting layer 125 is a layer that emits light by application of a voltage between the anode 121 and the transparent cathode 127.

The electron transfer layer 126 is an intermediate layer that is made primarily of an electron transporting material and formed spanning the bank 122 on the organic light emitting layer 125 to extend to above the auxiliary line 131, which will be described later with reference to FIG. 2.

The transparent cathode 127 is a second electrode that is formed spanning the bank 122 on the electron transfer layer 126 to extend to above the auxiliary line 131, which will be described later with reference to FIG. 2, and that is formed on the entire surfaces of all of the pixels 20. The transparent cathode 127 is a transparent electrode provided continuously on each pixel 20. In the case of adopting the top emission method, the transparent cathode 127 may preferably be, but is not limited to, a metal thin film such as indium tin oxide, indium zinc oxide, magnesium, aluminum, or silver.

Alternatively, an electron injection layer may be provided between the electron transfer layer 126 and the transparent cathode 127.

As illustrated in FIG. 3, the pixel 20 includes the connection unit 20C in which the auxiliary line 131 is disposed, in the area that is adjacent to the sub-pixel 20R and between the sub-pixel 20R and a sub-pixel of another pixel 20. The auxiliary line 131 is formed on the drive circuit layer 11 and spaced from the anode 121. The electron transfer layer 126 and the transparent cathode 127 that extend from above the anode 121 are formed on the auxiliary line 131.

That is, the display unit 100 includes the anodes 121 and the organic light emitting layers 125 that are alienated on a sub-pixel basis, and the auxiliary lines 131 that are disposed for each pixel column. This configuration will reduce wiring resistance that depends on the distance from a feeder line 30 and suppress fluctuations of the pixel driving voltage, thus achieving a color display device with high display quality.

The stacked structure of the auxiliary line 131, the electron transfer layer 126, and the transparent cathode 127 illustrated in FIG. 3 causes a pixel current $I_{pix}$ that flows from the driving transistor of the drive circuit layer 11 through the anode 121, the hole injection layer 123, the hole transfer layer 124, the organic light emitting layer 125, and the electron transfer layer 126 to the transparent cathode 127 to further flow into the electron transfer layer 126 and the auxiliary line 131 on the auxiliary line 131.

According to the above configuration, the auxiliary line 131 is formed with the electron transfer layer 126 left in the connection unit 20C. That is, the configuration will reduce the amount of voltage drop in a simplified manufacturing process without requiring either a high-precision mask for film deposition or an alignment step.

[1-2. Progressive Driving Method]

Figure 4:
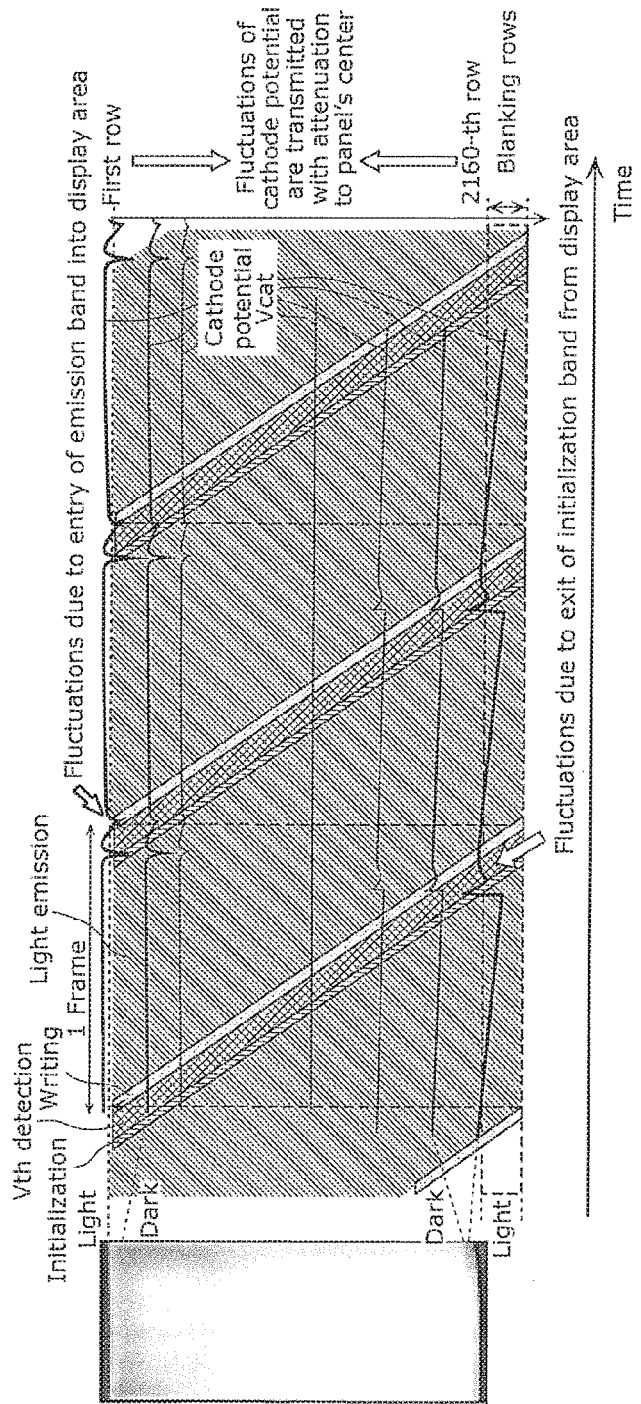
FIG. 4 is an operation transition diagram illustrating a progressive driving method used in a conventional display device.

FIG. 4 is an operation transition diagram illustrating a progressive driving method used in a conventional display device. In FIG. 4, the horizontal axis indicates time, and the vertical axis indicates the pixel row (display line). FIG. 4 illustrates that an initialization operation, a threshold-voltage (Vth) detection operation, a write operation, and a light emission operation are sequentially performed for each row of the display panel in which a plurality of pixels are disposed in rows and columns. Here, the number of rows of the display panel is assumed to be 2160, for example.

FIG. 4 further illustrates virtual rows (2161-th and subsequent rows) as blanking rows. The blanking rows correspond to a vertical blanking period that is provided to ensure time for a gate driver to return scanning from the scanning last row (2160-th row) to the scanning start row (first row), and express the vertical blanking period as the number of scanning rows corresponding to the virtual blanking period.

The initialization period, the Vth detection period, the writing period, and the light emission period are allocated to the scanning rows of the display panel illustrated in FIG. 4, and the blanking period is also allocated to the scanning rows, independently of the allocation of the above four periods.

[1-3. Pixel Circuit Configuration and Driving Method]

A pixel circuit including an organic EL element is illustrated below in order to describe a problem that arises when a cathode potential fluctuates in relation to the above four periods and the blanking period.

Figure 5A:
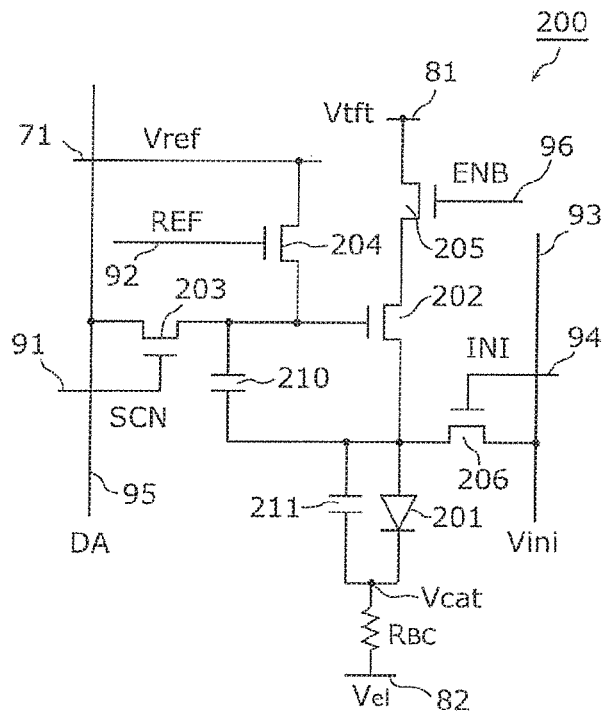
FIG. 5A illustrates an example of a pixel circuit configuration in the display device.
Figure 5B:
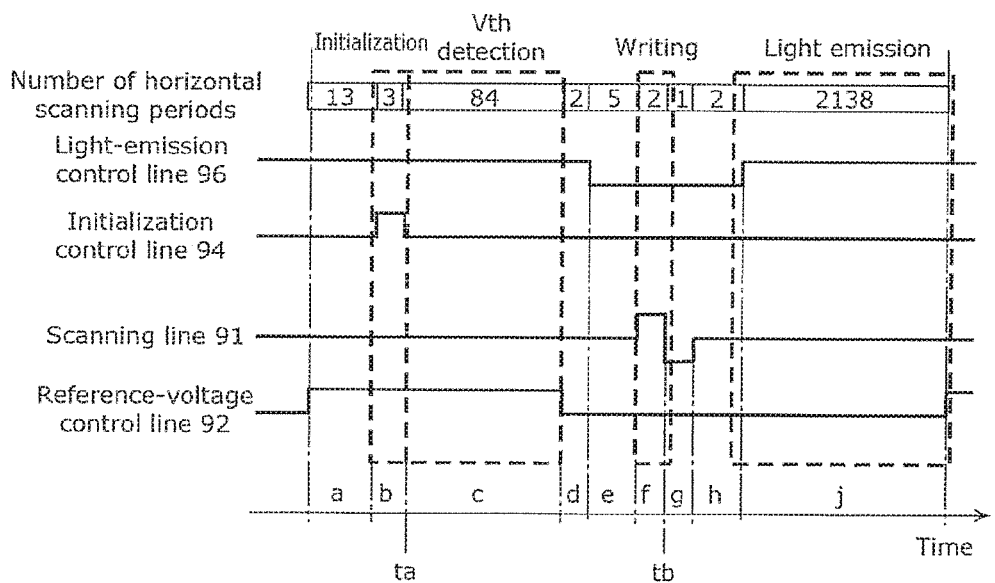
FIG. 5B illustrates an example of an operation timing chart of a pixel circuit in the display device.

FIG. 5A illustrates an example of the pixel circuit configuration in the display device. FIG. 5B illustrates an example of an operation timing chart of the pixel circuit in the display device. FIG. 5A illustrates a circuit of one pixel among a plurality of pixels disposed in rows and columns on an organic EL panel. The pixel 200 includes an organic EL element 201, a driving transistor 202, switches 203 to 206, and a capacitive element 210. The pixel 200 also includes wiring that includes a reference power line 71, an EL-anode power line 81 (Vtft), an EL-cathode power line 82 (Vel), an initialization power line 93 (Vini), a scanning line 91, a reference-voltage control line 92, an initialization control line 94, a light-emission control line 96, and a data line 95.

Next is a description of a method for driving a pixel circuit illustrated in FIG. 5B. In FIG. 5B, the horizontal axis indicates time, and the number of horizontal scanning periods (H) allocated to each operation and the waveform charts of voltages generated on the light-emission control line 96, the initialization control line 94, the scanning line 91, and the reference-voltage control line 92 for a corresponding row of pixels 200 among the pixels of the display panel are given along the vertical axis direction.

The above driving method is achieved by implementing periods a to j with the above-described configuration of the pixel 200.

[Period a]

In the period a, light emission of the organic EL element 201 is stopped by turning only the switch 204 on and setting the gate potential of the driving transistor 202 to a reference voltage Vref.

[Period b]

In the period b, the switch 206 is turned on to stabilize the source potential of the driving transistor 202 (the source potential of the driving transistor 202 is set to an initialization voltage Vini). The period b is the initialization period during which the capacitive element 210 is charged to a voltage necessary to turn the driving transistor 202 on in the initial state (time ta) of the driving transistor 202 during the Vth detection period. The initialization voltage Vini is set such that a potential difference (Vini−Vel) is smaller than the threshold voltage of the organic EL element 201. More preferably, (Vini−Vel)<0.

[Period c]

In the period c, the threshold voltage of the driving transistor 202 is detected with the capacitive element 210.

More specifically, the voltage levels of the scanning line 91 and the initialization control line 94 are kept LOW and the voltage levels of the reference-voltage control line 92 and the light-emission control line 96 are kept HIGH. That is, the switches 203 and 206 are kept off, and the switches 204 are kept on.

At this time, drain current flows due to the voltage setting in the initialization period, while no current flows through the organic EL element 201, and the source potential of the driving transistor 202 changes. In other words, the source potential of the driving transistor 202 changes until the drain current supplied by the voltage Vtft on the EL-anode power line 81 becomes zero. In this way, the operation of detecting the threshold voltage of the driving transistor 202 is started.

At the end of the period c, the potential difference between the first and second electrodes of the capacitive element 210 (gate-source voltage of the driving transistor 202) becomes a potential difference that corresponds to the threshold voltage Vth of the driving transistor 202. The period c is the Vth detection period during which the threshold voltage of the driving transistor 202 is detected.

[Period d]

In the period d, the voltage level of the reference-voltage control line 92 is changed from HIGH to LOW so as to turn the switch 204 off and end the threshold-voltage detection operation.

[Period e]

In the period e, the voltage level of the light-emission control line 96 is changed from HIGH to LOW. That is, the switches 203, 204, 205, and 206 are off. This completes preparation for writing a signal voltage.

[Period f]

The period f is the writing period during which an image signal voltage (data signal voltage) corresponding to display gradation is obtained from the data line 95 into the pixel 200 and written to the capacitive element 210. More specifically, the switch 203 is turned on so that the data signal voltage is applied via the data line 95 and the switch 203 to the first electrode of the capacitive element 210. Accordingly, a voltage difference between the data signal voltage and the reference voltage Vref is multiplied by (electrostatic capacitance of capacitor 211)/(electrostatic capacitance of capacitor 211+electrostatic capacitance of capacitive element 210) and stored (held) in the capacitive element 210, along with the threshold voltage Vth of the driving transistor 202 held in the Vth detection period. The capacitor 211 may be parasitic capacitance of the organic EL element 201, or may be formed in the TFT step like the capacitive element 210. Here, the driving transistor 202 does not pass the drain current because the switch 205 is off.

[Periods g and h]

In the period g, a HIGH-to-LOW transition of the scanning line 91 is quickly completed by setting the potential of the scanning line 91 to a level lower than the ordinary LOW level at the end of the writing period. Accordingly, writing is reliably completed even if the display panel has a large screen and a large number of pixels so that the load on the scanning line 91 (wiring time constant) is high and both LOW-to-HIGH and HIGH-to-LOW transitions take time.

[Period j]

The period j is the light emission period. More specifically, the voltage level of the light-emission control line 96 is changed from LOW to HIGH while the voltage levels of the scanning line 91, the reference-voltage control line 92, and the initialization control line 94 are kept LOW. That is, the switch 205 is turned on while the switches 203, 204, and 206 are kept off.

By turning the switch 205 on in this way, current corresponding to the voltage stored in the capacitive element 210 is supplied to the organic EL element 201 and causes the organic EL element 201 to emit light.

As described above, the periods a to j include the initialization period, the Vth detection period, the writing period, and the light emission period.

[1-4. Fluctuations of Cathode Potential Vcat]

According to the progressive driving method for the display panel, the pixel circuit, and the method for driving the pixel circuit described above, the cathode voltage Vcat fluctuates greatly in the upper and lower edge portions of the display panel as illustrated in FIG. 4. This fluctuations of the cathode voltage Vcat in the upper and lower edge portions of the display panel will propagate into the display area through the transparent cathode 127. Conceivable causes of this include: (1) high connection resistance $R_{BC}$ between the auxiliary line 131 and the transparent cathode 127 in the connection unit 20C; (2) connection of all pixels through the transparent cathode 127; and (3) the entry of the initialization period and the light emission period from the blanking rows into the display area, or the exit of these periods from the display area into the blanking rows, at the upper and lower edges of the display panel.

Figure 6:
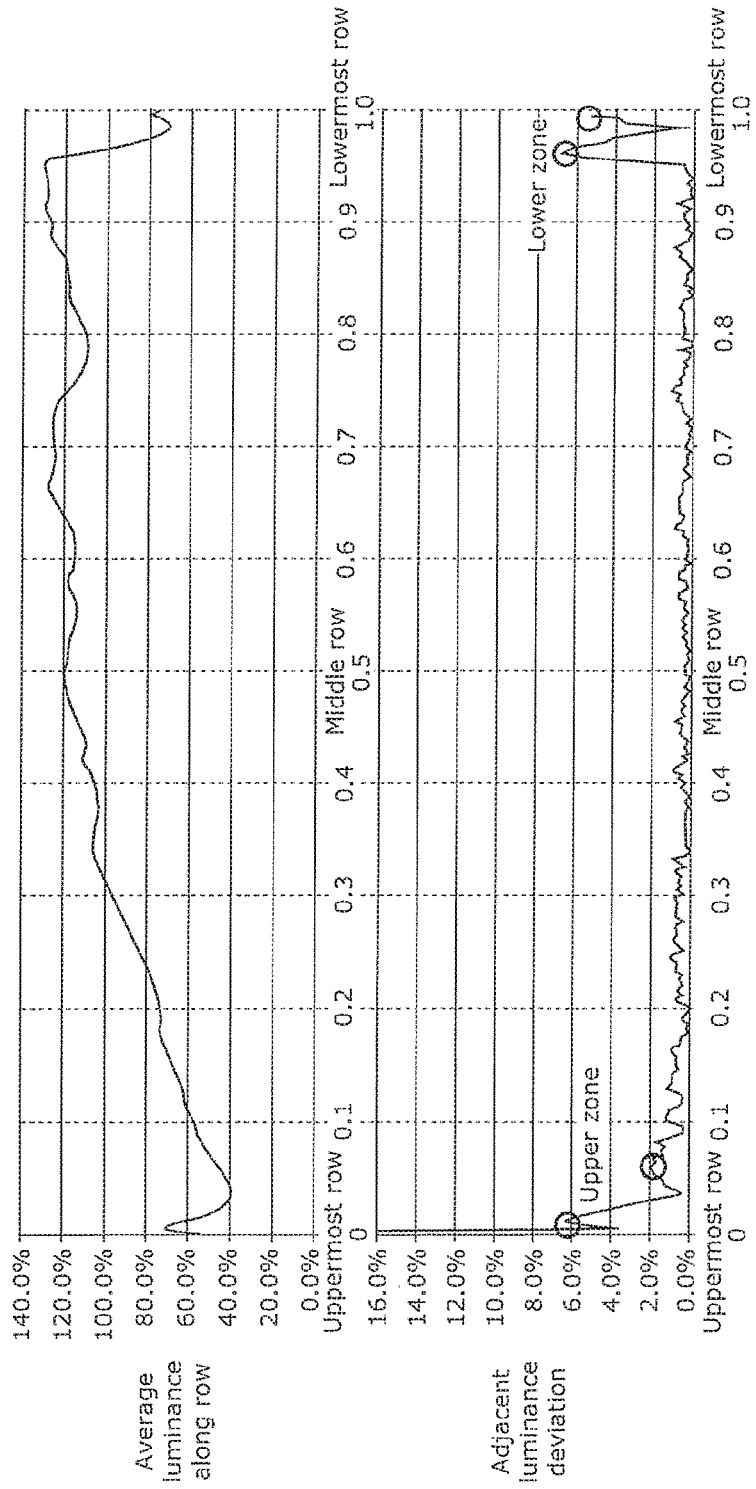
FIG. 6 is a graph illustrating unevenness in the luminance of a display panel that displays a uniform image.

FIG. 6 is a graph illustrating unevenness in the luminance of the display panel that displays a uniform image. In FIG. 6, the horizontal axis indicates the pixel row, and the vertical axis indicates the average luminance along the row (upper section) and the adjacent luminance deviation (lower section). The upper section of FIG. 6 illustrates the average luminance for each pixel row, and the lower section illustrates the luminance deviation between adjacent rows. As illustrated in the lower section of FIG. 6, an upper edge portion (upper zone) of the display panel and a lower edge portion (lower zone) thereof each include two pixel rows that take maximum values for the adjacent luminance deviation. These pixel rows taking maximum values for the adjacent luminance deviation correspond to light pixel rows (light zone) and dark pixel rows (dark zone) in FIG. 4 and cause unevenness in display in the upper and lower edge portions of the display panel as indicated by the left section in FIG. 4.

Now, a description is given in which the above unevenness in display in the upper and lower edge portions of the display panel is caused by the fluctuations of the cathode voltage Vcat generated at the upper and lower edges of the display panel.

FIG. 7 illustrates the relationship between the cathode potential and Vgs in the upper and lower edge portions of the display panel. FIG. 7 shows that the fluctuations of the cathode voltage Vcat causes fluctuations of the gate-source voltage Vgs of the driving transistor 202. The source electrode of the driving transistor 202 fluctuates following the fluctuations of the cathode potential Vcat because it is connected to the cathode electrode of the organic EL element 201 via the capacitor 211.

[1-5. Fluctuations of Vgs in Upper Edge Portion of Panel]

As illustrated in the first section of FIG. 7, in the uppermost pixel row in the upper edge portion of the display panel, the cathode potential Vcat changes abruptly to a potential corresponding to the initialization voltage Vini in the initialization period b by the application of the initialization voltage Vini to the source electrode of the driving transistor 202.

The cathode potential Vcat then increases as the period transitions from an initialization completion time ta to the Vth detection period c, and the drain current of the driving transistor 202 flows and the source potential of the driving transistor 202 changes while no current flows through the organic EL element 201. Thereafter, the flow of the drain current stops at the end of the Vth detection period, and the cathode potential Vcat decreases slowly as the period transitions from the period d through the period e, the writing period f, and the period g to the period h.

After this, in the uppermost pixel row, the light emission period enters the display area from the blanking rows, while the period transitions from a write completion time tb to the light emission period j. Due to this entry of the light emission period from the virtual area to the display area, the drain current of the driving transistor 202 causes an abrupt flow of current into the organic EL element 201. Accordingly, the cathode potential Vcat starts an abrupt voltage rise.

Here, in the pixels in the uppermost row, the cathode potential Vcat at the write completion time tb decreases from its value at the initialization completion time ta, and accordingly Vgs increases.

On the other hand, as illustrated in the second section of FIG. 7, the fluctuations of the cathode potential Vcat in a pixel row that is located a predetermined number of pixel rows inward of (below) the upper edge of the display panel reflect the fluctuations of the cathode potential Vcat in the uppermost pixel row located in close proximity. At this time, the initialization completion time ta and the write completion time tb in the pixel row located a predetermined number of pixel rows inward of (below) the uppermost row are shifted to the right by row-by-row sequential scanning starting from the uppermost row. As a result, a predetermined pixel row (pixel row located inward of the uppermost row) whose initialization completion time ta coincides with the minimum point of Vcat generated at the write completion time tb in the uppermost row exists in the vicinity of the upper edge of the panel. In this case, in this predetermined pixel row, the cathode potential Vcat at the write completion time tb increases from its value at the initialization completion time ta, and accordingly Vgs decreases.

Due to the above fluctuations of the cathode potential Vcat and the gate-source voltage Vgs of the driving transistor 202 in the upper edge portion of the panel, the uppermost pixel row makes a light zone along with an increase in Vgs at the time of light emission, and the above predetermined pixel row makes a dark zone along with a decrease in Vgs at the time of light emission. This contrast of lightness and darkness is visually recognized as strip-like unevenness.

[1-6. Fluctuations of Vgs in Lower Edge Portion of Panel]

As illustrated in the fourth section of FIG. 7, in the lowermost pixel row in the lower edge portion of the display panel, the cathode potential Vcat changes abruptly to a potential corresponding to the initialization voltage Vini in the initialization period b by the application of the initialization voltage Vini to the source electrode of the driving transistor 202. Thereafter, in the lowermost pixel row, the initialization period exits from the display area into the blanking rows. Due to this exit of the initialization period from the display area to the virtual area, the charging current applied to the capacitive element 210 and the capacitor 211 decreases dramatically. Accordingly, the cathode potential Vcat in the lowermost row starts a voltage drop. At this time, the period transitions from the Vth detection period c through the period d, the period e, the writing period f, and the period g to the period h.

Here, in the pixels in the lowermost row, the cathode potential Vcat at the write completion time tb decreases from its value at the initialization completion time ta, and accordingly Vgs increases.

On the other hand, as illustrated in the third section of FIG. 7, the fluctuations of the cathode potential Vcat in a pixel row that is located a predetermined number of pixel rows inward of (above) the lowermost row of the display panel reflect the fluctuations of the cathode potential Vcat in the lowermost pixel row located in close proximity. At this time, the initialization completion time ta and the write completion time tb in the pixel row located a predetermined number of pixel rows inward (upward) are shifted to the left from the initialization completion time ta and the write completion time tb in the lowermost pixel row. As a result, a predetermined pixel row (pixel row located inward of the lowermost row) whose write completion time tb coincides with the maximum point of Vcat generated around the initialization completion time ta in the lowermost row exists in the vicinity of the lower edge of the panel. In this case, in this predetermined pixel row, the cathode potential Vcat at the write completion time tb increases from its value at the initialization completion time ta, and accordingly Vgs decreases.

Due to the above fluctuations of the cathode potential Vcat and Vgs in the lower edge portion of the panel, the lowermost pixel row makes a light zone along with an increase in Vgs at the time of light emission, and the above predetermined pixel row makes a dark zone along with a decrease in Vgs at the time of light emission. This contrast of lightness and darkness is visually recognized as strip-like unevenness. As a result of eager consideration, the inventors of the present invention have found, as described above, that the unevenness in display such as the presence of light and dark zones in the upper and lower edge portions of the display panel is caused by the fluctuations of Vgs for the aforementioned reasons (1) to (3).

As described above, in the display device that has a pixel configuration including the connection unit at which the second electrode and the auxiliary line are connected to each other via the functional layer and that performs progressive driving including the blanking period, the cathode potential Vcat fluctuates in the upper and lower edge portions of the display panel in accordance with the timing of the initialization period and the light emission period into the blanking rows and the timing of entry of the initialization period and the light emission period into the display area. Accordingly, there is a problem in that unevenness in display occurs in the upper and lower edge portions of the display panel.

To solve this problem, a method for driving a display device according to an embodiment of the present invention is a method for driving a display device that includes a display unit and is driven by a sequence of row-by-row sequential scanning that includes a vertical blanking period, the display unit having pixels arranged in rows and columns, each of the pixels including a first electrode formed on a drive circuit substrate on which a circuit element is formed, a light emitting layer formed above the first electrode and including a light emitting substance, and a second electrode formed above the light emitting layer. The method includes initializing a light emitting element and the circuit element, writing a signal voltage to the circuit element after the initializing, inserting, after the writing, a black display to display the black display without causing the light emitting element to emit light during a first period that is determined based on a resistance value of the second electrode, and causing the light emitting element to emit light after the inserting.

According to this method, since the first period for black insertion is provided in accordance with the resistance value of the second electrode, a pixel row whose period from the initialization completion timing to the write timing coincides with the timing of fluctuations of the potentials of the second electrodes generated in the pixels in the lowermost row at the time of entry of the light emission period from the blanking rows into the display area can be shifted more inward (downward). Accordingly, the fluctuations of the writing voltage will occur in pixel rows in which the fluctuations of the potentials of the second electrodes are more attenuated. It is thus possible to suppress time-varying fluctuations of the writing voltage of the circuit element corresponding to the signal voltage and to reduce unevenness in display such as the presence of light and dark zones in the upper edge portion of the display unit, caused by the time-varying fluctuations.

In the inserting, the first period may be set shorter as the resistance value of the second electrode increases, when the black display is displayed without the light emitting element being caused to emit light.

The fluctuations of the potentials of the second electrodes generated in the uppermost row are transmitted with a higher attenuation factor to inward (downward) pixel rows as the resistance value of the second electrode increases. That is, the fluctuations of the potentials of the second electrodes generated in the uppermost row are more apt to have an influence on inward (downward) pixel rows during the period from the initialization completion timing to the write timing, as the resistance value of the second electrode decreases. From this viewpoint, if the first period is set longer as the resistance value decreases, a pixel row whose period from the initialization completion timing to the write timing coincides with the timing of fluctuations of the potentials of the second electrodes generated in the uppermost row can be shifted more inward (downward). It is thus possible to suppress time-varying fluctuations of the writing voltage of the circuit element corresponding to the signal voltage and to reduce unevenness in display such as the presence of light and dark zones in the upper edge portion of the display unit, caused by the time-varying fluctuations.

In the inserting, the first period may be determined to satisfy a relation of:

$$T1 \geq -0.150R + 148.69$$

where R ($\Omega$/sq.) is a sheet resistance of the second electrode, 1H is a unit horizontal scanning period in the row-by-row sequential scanning, and T1 (H) is the first period.

In this case, the first period is set with an indicator that is defined by the limit of human sensitivity to unevenness in display. Thus, unevenness in display can be reduced with high precision.

In the light emitting, potentials of the second electrodes of pixels in an uppermost row of the display unit may fluctuate at a light-emission start timing in the uppermost row of the display unit. In the initializing, an initialization completion timing in a pixel row that is located a predetermined number of pixel rows below the uppermost row of the display unit may coincide with the light-emission start timing in the uppermost row of the display unit.

The initializing may be implemented during a second period that is determined based on a resistance value of the second electrode.

According to this method, since the second period for the initializing is provided in accordance with the resistance value of the second electrode, a pixel row whose write completion timing coincides with the timing of fluctuations of the potentials of the second electrodes generated in the pixels in the lowermost row at the time of exit of the initialization period from the display area into the blanking period can be shifted more inward (upward). Accordingly, the fluctuations of the writing voltage will occur in pixel rows in which the fluctuations of the potentials of the second electrodes are more attenuated. It is thus possible to suppress time-varying fluctuations of the writing voltage of the circuit element corresponding to the signal voltage and to reduce unevenness in display such as the presence of light and dark zones in the upper and lower edge portions of the display unit, caused by the time-varying fluctuations.

The initializing may be implemented while the second period is set shorter as the resistance value of the second electrode increases.

The fluctuations of the potentials of the second electrodes generated in the lowermost row are transmitted with a higher attenuation factor to inward (upward) pixel rows as the resistance value of the second electrode increases. That is, the fluctuations of the potentials of the second electrodes generated in the lowermost row are more apt to have an influence on inward (upward) pixel rows at the write completion timing, as the resistance value of the second electrode decreases. From this viewpoint, if the second period is set longer as the resistance value decreases, a pixel row whose write completion timing coincides with the timing of fluctuations of the potentials of the second electrodes generated in the lowermost row can be shifted more inward (upward). It is thus possible to suppress time-varying fluctuations of the writing voltage of the circuit element corresponding to the signal voltage and to reduce unevenness in display such as the presence of light and dark zones in the upper and lower edge portions of the display unit, caused by the time-varying fluctuations.

In the initializing, the second period may be determined to satisfy a relation of:

$$T2 \geq -0.0552R + 139.05$$

where R ($\Omega$/sq.) is a sheet resistance of the second electrode, 1H is a unit horizontal scanning period in the row-by-row sequential scanning, and T2 (H) is the second period.

In this case, the first period and the second period are set with an indicator that is defined by the limit of human sensitivity to unevenness in display. Thus, unevenness in display can be reduced with high precision.

A method for driving a display device according to another embodiment of the present invention is a method for driving a display device that includes a display unit and is driven by a sequence of row-by-row sequential scanning that includes a vertical blanking period, the display unit having pixels arranged in rows and columns, each of the pixels including a first electrode formed on a drive circuit substrate on which a circuit element is formed, a light emitting layer formed above the first electrode and including a light emitting substance, and a second electrode formed above the light emitting layer. The method includes initializing a light emitting element and the circuit element during a second period that is determined based on a resistance value of the second electrode, writing a signal voltage to the circuit element after the initializing, and causing the light emitting element to emit light after the writing.

According to this method, since the second period for initialization is provided in accordance with the resistance value of the second electrode, a pixel row whose period from the initialization completion timing to the write timing coincides with the timing of fluctuations of the potentials of the second electrodes generated in the pixels in the lowermost row at the time of exit of the initialization period from the display area into the blanking rows can be shifted more inward (upward). Accordingly, the fluctuations of the writing voltage will occur in pixel rows in which the fluctuations of the potentials of the second electrodes are more attenuated. It is thus possible to suppress time-varying fluctuations of the writing voltage of the circuit element corresponding to the signal voltage and to reduce unevenness in display such as the presence of light and dark zones in the lower edge portion of the display unit, caused by the time-varying fluctuations.

In the initializing, the light emitting element and the circuit element may be initialized while the second period is set shorter as the resistance value of the second electrode increases.

The fluctuations of the potentials of the second electrodes generated in the lowermost row are transmitted with a higher attenuation factor to inward (upward) pixel rows as the resistance value of the second electrode increases. That is, the fluctuations of the potentials of the second electrodes generated in the lowermost row are more apt to have an influence on inward (upward) pixel rows during the period from the initialization completion timing to the write timing, as the resistance value of the second electrode decreases. From this viewpoint, if the second period is longer as the resistance value decreases, a pixel row whose period from the initialization completion timing to the write timing coincides with the timing of fluctuations of the potentials of the second electrodes generated in the lowermost row can be shifted more inward (upward). It is thus possible to suppress time-varying fluctuations of the writing voltage of the circuit element corresponding to the signal voltage and to reduce unevenness in display such as the presence of light and dark zones in the lower edge portion of the display unit, caused by the time-varying fluctuations.

In the initializing, the second period may be determined to satisfy a relation of:

$$T2 \geq -0.0552R + 139.05$$

where R ($\Omega$/sq.) is a sheet resistance of the second electrode, 1H is a unit horizontal scanning period in the row-by-row sequential scanning, and T2 (H) is the second period.

In this case, the second period is set with an indicator that is defined by the limit of human sensitivity to unevenness. Thus, unevenness in display can be reduced with high precision.

In the initializing, potentials of the second electrodes of pixels in a lowermost row of the display unit may fluctuate at an initialization timing in the lowermost row of the display unit. In the writing, a write completion timing in a pixel row that is located a predetermined number of pixel rows above the lowermost row of the display unit may coincide with the initialization timing in the lowermost row of the display unit.

The present invention may be implemented not only as the method for driving a display device that includes characteristic steps described above, but also as a display device that includes a control unit configured to execute the characteristic steps of the driving method. Even in this case, similar effects to those described above will be achieved.

A display device according to an embodiment of the present invention is a display device that includes a display unit and is driven by a sequence of row-by-row sequential scanning that includes a vertical blanking period, the display unit having pixels arranged in rows and columns, each of the pixels including a light emitting element and a circuit element for driving light emission of the light emitting element. The pixel includes a first electrode formed on a drive circuit substrate on which the circuit element is formed, a light emitting layer formed above the first electrode and including a light emitting substance, and a second electrode formed above the light emitting layer. The display device further includes a control unit configured to execute applying an initialization voltage to the first electrode, writing a signal voltage to the circuit element after the initializing, inserting, after the writing, a black display to display the black display without causing the light emitting element to emit light during a first period that is determined based on a resistance value of the second electrode, and causing the light emitting element to emit light after the inserting.

A display device according to another embodiment of the present invention is a display device that includes a display unit and is driven by a sequence of row-by-row sequential scanning that includes a vertical blanking period, the display unit having pixels arranged in rows and columns, each of the pixels including a light emitting element and a circuit element for driving light emission of the light emitting element. The pixel includes a first electrode formed on a drive circuit substrate on which the circuit element is formed, a light emitting layer formed above the first electrode and including a light emitting substance, and a second electrode formed above the light emitting layer. The display device further includes a control unit configured to execute applying an initialization voltage to the first electrode during a second period that is determined based on a resistance value of the second electrode, writing a signal voltage to the circuit element after the initializing, and causing the light emitting element to emit light after the writing.

The following describes embodiments of the display device and the method for driving a display device with reference to drawings. Each of the embodiments described below illustrates a preferable specific example of the present disclosure. Accordingly, numerical values, shapes, materials, constituent elements, the arrangement, position, and connection of the constituent elements, steps, the order of the steps, and so on in the following embodiments are mere examples and do not intend to limit the scope of the present invention. Of the constituent elements described in the following embodiments, those that are not recited in any independent claims, which represent the broadest concept, are described as optional constituent elements.

Each drawing is a schematic and does not necessarily provide precise depiction. Constituent elements that are substantially the same are given the same reference numerals or characters throughout the drawings, and a detailed description thereof will be omitted or simplified.

EMBODIMENTS

A display device 1 according to an embodiment will be described with reference to drawings.

Figure 8:
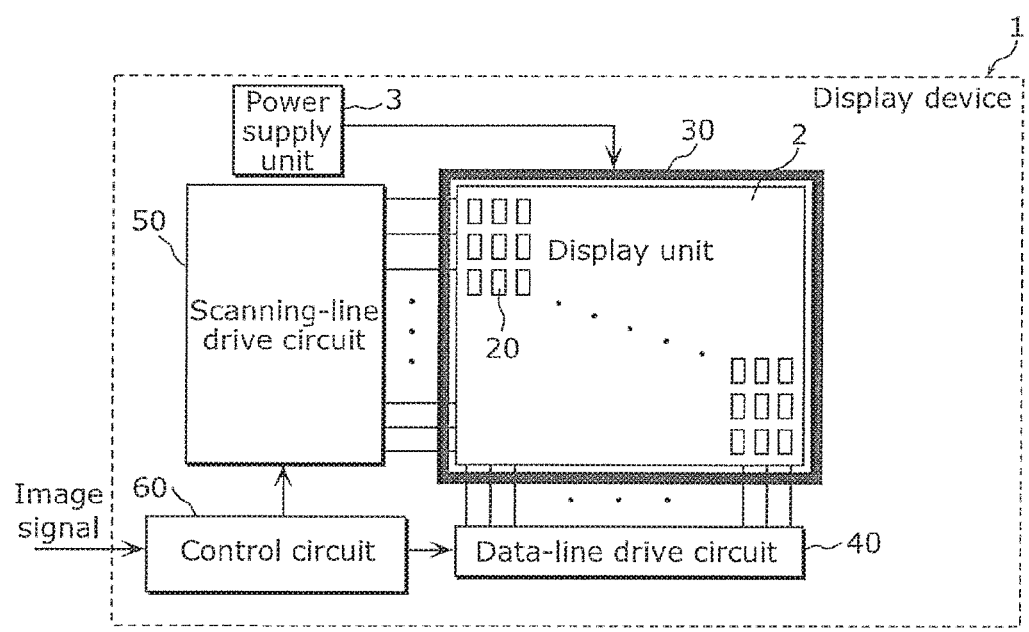
FIG. 8 is a functional block diagram illustrating an overall configuration of the display device according to an embodiment.

FIG. 8 is a functional block diagram illustrating an overall configuration of the display device according to the embodiment.

[2-1. Overall Configuration of Display Device]

The display device 1 according to the present embodiment includes a display unit 2, a power supply unit 3, a data-line drive circuit 40, a scanning-line drive circuit 50, and a control circuit 60.

The display unit 2 has pixels 20 arranged in rows and columns, each pixel having an organic EL element and a circuit element for driving light emission of the organic EL element.

The power supply unit 3 supplies a power supply voltage to each pixel 20 from the feeder line 30 disposed in the outer peripheral region of the display unit 2. The feeder line 30 includes a positive-voltage feeder line for transmitting a positive power supply voltage and a negative-voltage feeder line for transmitting a negative power supply voltage having a lower potential than the positive power supply voltage.

The control circuit 60 generates a control signal S4 for controlling the data-line drive circuit 40 on the basis of an image signal received from the outside and outputs the generated control signal S4 to the data-line drive circuit 40. The control circuit 60 also generates a control signal 55 for controlling the scanning-line drive circuit 50 on the basis of an input synchronizing signal and outputs the generated control signal 55 to the scanning-line drive circuit 50.

The data-line drive circuit 40 drives the data lines of the display unit 2 on the basis of the control signal S4 generated by the control circuit 60. More specifically, the data-line drive circuit 40 outputs a data voltage that reflects the image signal to each pixel circuit on the basis of the image signal and a horizontal synchronizing signal.

The scanning-line drive circuit 50 drives the scanning lines of the display unit 2 on the basis of the control signal 55 generated by the control circuit 60. More specifically, the scanning-line drive circuit 50 outputs, for example, a scanning signal to each pixel circuit at least in units of display lines on the basis of a vertical synchronizing signal and the horizontal synchronizing signal.

[2-2. Configuration for Reducing Voltage Drop]

The configuration for reducing a voltage drop in the display device according to the present embodiment is similar to the configuration described in 1-1 above with reference to FIGS. 1 to 3, and therefore a description thereof will be omitted.

[2-3. Progressive Driving Method]

Figure 9:
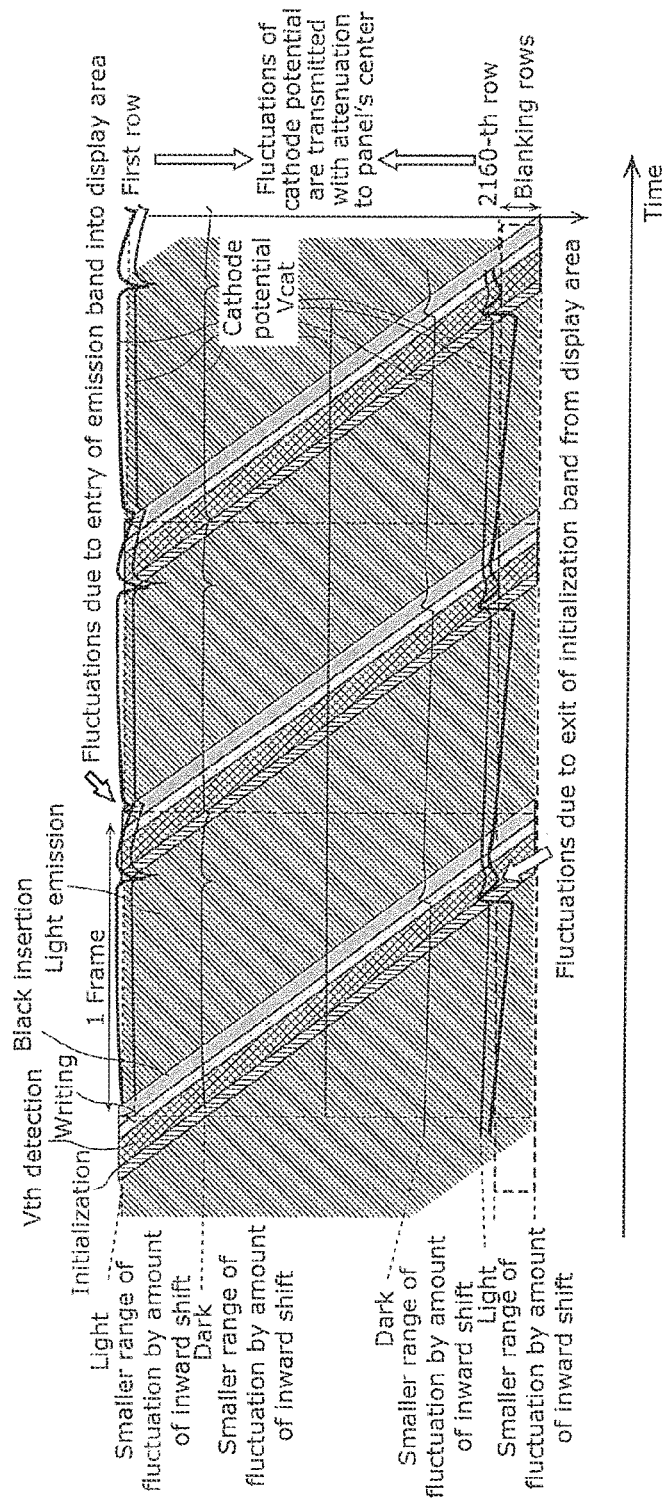
FIG. 9 is an operation transition diagram illustrating a progressive driving method used in the display device according to an embodiment.

FIG. 9 is an operation transition diagram illustrating the progressive driving method used in the display device according to the embodiment. In FIG. 9, the horizontal axis indicates time, and the vertical axis indicates the pixel row (display line). FIG. 9 illustrates that an initialization operation, a threshold-voltage (Vth) detection operation, a write operation, a black insertion operation, and a light emission operation are sequentially performed for each row of the display panel in which a plurality of pixels are disposed in rows and columns. Here, the number of rows of the display panel is assumed to be 2160, for example. FIG. 9 further illustrates virtual rows (2161-th and subsequent rows) as blanking rows.

The initialization period, the Vth detection period, the writing period, the black insertion period, and the light emission period are allocated to the scanning rows of the display panel illustrated in FIG. 9, and the blanking period is also allocated to the scanning rows, independently of the allocation of the above five periods.

[2-4. Pixel Circuit Configuration and Driving Method]

The pixel circuit for driving the above five periods and the blanking period has a circuit configuration similar to that illustrated in FIG. 5A, and therefore a description thereof will be omitted.

The following describes a method for driving a pixel circuit according to the present embodiment.

Figure 10:
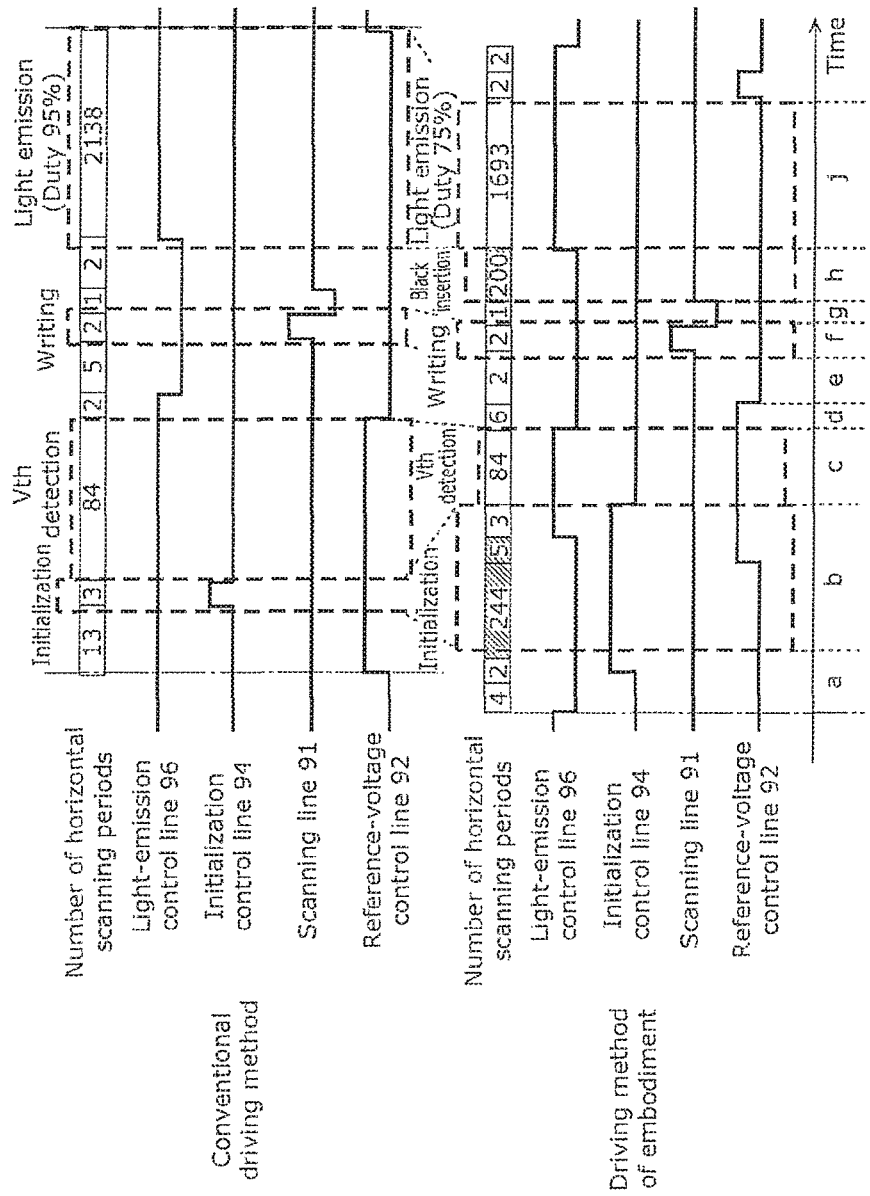
FIG. 10 illustrates an example of an operation timing chart for comparison between the method for driving a display device according to an embodiment and a conventional method for driving a display device.

FIG. 10 illustrates an example of operation timing charts for comparison between the method for driving a display device according to the embodiment and a conventional method for driving a display device. In FIG. 10, the horizontal axis indicates time, and the number of horizontal scanning periods (H) allocated to each operation and the waveform charts of voltages generated on the light-emission control line 96, the initialization control line 94, the scanning line 91, and the reference-voltage control line 92 for a corresponding row of pixels 200 among the pixels of the display panel are given along the vertical axis direction.

The method for driving a display device according to the present embodiment is achieved by implementing the following periods a to j with the configuration of the pixels 200.

[Period a]

In the period a, light emission of the organic EL element 201 is stopped by turning the switch 205 off.

[Period b]

In the period b, the switch 206 is turned on to apply the initialization voltage Vini to the source electrode of the driving transistor 202. Then, after the elapse of, for example, 244 H, the switch 204 is turned on to apply the reference voltage Vref to the gate electrode of the driving transistor 202. Then, after the elapse of, for example, 5 H, the switch 205 is turned on (the source potential of the driving transistor 202 is set to the initialization voltage Vini).

The period b is the initialization period during which the capacitive element 210 is charged to a voltage necessary to turn the driving transistor 202 on in the initial state of the driving transistor 202 during the Vth detection period. The initialization voltage Vini is set such that the potential difference (Vini−Vel) is smaller than the threshold voltage of the organic EL element 201. More preferably, (Vini−Vel)<0.

In the driving method according to the present embodiment, the second period, which is the initialization period, is set longer by 249 H than the initialization period in the conventional driving method. The initialization period in the present embodiment is determined based on the resistance value of the transparent cathode 127. For example, the control circuit 60 sets the initialization period shorter as the resistance value of the transparent cathode 127 increases.

[Period c]

In the period c, the threshold voltage of the driving transistor 202 is detected with the capacitive element 210. More specifically, the voltage levels of the scanning line 91 and the initialization control line 94 are kept LOW, and the voltage levels of the reference-voltage control line 92 and the light-emission control line 96 are kept HIGH. That is, the switches 203 and 206 are kept off, and the switches 204 and 205 are kept on.

At this time, drain current flows due to the voltage setting in the initialization period, while no current flows through the organic. EL element 201, and the source potential of the driving transistor 202 changes. In other words, the source potential of the driving transistor 202 changes until the drain current supplied by the voltage Vtft of the EL-anode power line 81 becomes zero. In this way, the operation of detecting the threshold voltage of the driving transistor 202 is started.

At the end of the period c, the potential difference between the first and second electrodes of the capacitive element 210 (gate-source voltage of the driving transistor 202) becomes a potential difference that corresponds to the threshold voltage Vth of the driving transistor 20. The period c is the Vth detection period during which the threshold voltage of the driving transistor 202 is detected.

[Period d]

In the period d, the voltage level of the light-emission control line 96 is changed from HIGH to LOW so as to turn the switch 205 off.

[Period e]

In the period e, the voltage level of the reference-voltage control line 92 is changed from HIGH to LOW. That is, the switches 203, 204, 205, and 206 are off. This completes preparation for writing a signal voltage.

[Period f]

The period f is the writing period during which an image signal voltage (data signal voltage) corresponding to display gradation is obtained from the data line 95 into the pixel 200 and written to the capacitive element 210. More specifically, the switch 203 is turned on so that the data signal voltage is applied via the data line 95 and the switch 203 to the first electrode of the capacitive element 210. Accordingly, a voltage difference between the data signal voltage and the reference voltage Vref is multiplied by (electrostatic capacitance of the capacitor 211)/(electrostatic capacitance of the capacitor 211+electrostatic capacitance of the capacitive element 210) and stored (held) in the capacitive element 210, along with the threshold voltage Vth held in the Vth detection period. The capacitor 211 may be a parasitic capacitance of the organic EL element 201, or may be formed in the TFT step like the capacitive element 210. Here, the driving transistor 202 does not pass the drain current because the switch 205 is off.

[Period g]

In the period g, a HIGH-to-LOW transition of the scanning line 91 is quickly completed by setting the potential of the scanning line 91 to a level lower than the ordinary LOW level at the end of the writing period. Accordingly, writing is reliably completed even if the display panel has a large screen and a large number of pixels so that the load (wiring time constant) on the scanning line 91 is high and both LOW-to-HIGH and HIGH-to-LOW transitions take time.

[Period h]

In the period h, the switches 203, 204, 205, and 206 are kept off to not cause the organic EL element 201 to emit light. The period h is the black insertion period during which a black display is displayed without causing the organic EL element 201 to emit light.

In the driving method according to the present embodiment, for example, 200 H are allocated to the first period, which is the black insertion period, between the writing period and the light emission period, as compared with the conventional driving method. The black insertion period in the present embodiment is determined based on the resistance value of the transparent cathode 127. For example, the control circuit 60 sets the black insertion period shorter as the resistance value of the transparent cathode 127 increases.

[Period j]

The period j is the light emission period. More specifically, the voltage level of the light-emission control line 96 is changed from LOW to HIGH while the voltage levels of the scanning line 91, the reference-voltage control line 92, and the initialization control line 94 are kept LOW. That is, the switch 205 is turned on while the switches 203, 204, and 206 are kept off.

By turning the switch 205 on in this way, current corresponding to the voltage stored in the capacitive element 210 is supplied to the organic EL element 201 and causes the organic EL element 201 to emit light.

The periods a to j described above include the initialization period, the Vth detection period, the writing period, the black insertion period, and the light emission period.

In the driving method according to the present embodiment, the light-emission duty ratio is reduced to 95% to 75% by setting the initialization period longer and providing the black insertion period, as compared with the conventional driving method.

[2-5. Suppression of Fluctuations of Vgs in Lower Edge Portion of Panel]

As illustrated in FIG. 9, in the lowermost pixel row in the lower edge portion of the display panel, the cathode potential Vcat changes (increases) abruptly to a potential corresponding to the initialization voltage Vini in the initialization period b by the application of the initialization voltage Vini to the source electrode of the driving transistor 202. Thereafter, in the lowermost pixel row, the initialization period exists from the display area into the blanking rows. Due to this exit of the initialization period from the display area into the virtual area, the charging current applied to the capacitive element 210 and the capacitor 211 decreases dramatically. Accordingly, the cathode potential Vcat in the lowermost row starts a voltage drop. At this time, the period transitions from the Vth detection period c through the period d, the period e, the writing period f, and the period g to the black insertion period h.

Here, in the pixels in the lowermost low, the cathode potential Vcat at the write completion time decreases from its value at the initialization completion time, and accordingly Vgs increases. In the driving method according to the present embodiment, a row in which an increase of Vgs becomes a maximum in the lower edge portion of the display panel is shifted inward (upward) by setting the initialization period b longer than in the conventional driving method. In this case, the range of fluctuations of the cathode potential Vcat is suppressed by the amount of the inward (upward) shift of the pixel row from the lowermost row. Accordingly, an increase on Vgs is more suppressed than in the conventional driving method.

On the other hand, the fluctuations of the cathode potential Vcat in a pixel row that is located a predetermined number of pixel rows inward of (above) the lower edge of the display panel reflect the fluctuations of the cathode potential Vcat in the lowermost pixel row located in close proximity. At this time, the initialization completion time ta and the write completion time tb in the pixel row located a predetermined number of pixel rows inward (upward) are shifted to the left from the initialization completion time ta and the write completion time tb in the lowermost pixel row. As a result, a predetermined pixel row whose write completion time tb coincides with the maximum point of Vcat generated around the initialization completion time ta in the lowermost row exists in the vicinity of the lower edge of the panel. In the driving method according to the present embodiment, the predetermined pixel row whose write completion time tb coincides with the above maximum point is shifted more inward (upward) than in the conventional driving method by setting the initialization period b longer than in the conventional driving method on the basis of the resistance value of the transparent cathode 127. In this case, while in this predetermined pixel row, the cathode potential Vcat at the write completion time tb increases from its value at the initialization completion time ta, and accordingly Vgs decreases, this pixel row is shifted more inward (upward) than in the conventional driving method. Thus, the fluctuations of the cathode potential Vcat are transmitted with attenuation. This suppresses an increase in Vcat and accordingly suppresses a decrease in Vgs.

Due to the above fluctuations of the cathode potential Vcat and the gate-source voltage Vgs of the driving transistor 202 in the lower edge portion of the panel, pixel rows in the vicinity of the lowermost row make a light zone along with an increase in Vgs at the time of light emission, and the above predetermined pixel row makes a dark zone along with a decrease in Vgs at the time of light emission. However, in the driving method according to the present embodiment, a difference in luminance between the aforementioned light and dark zones in the lower edge portion of the display panel is more suppressed and accordingly unevenness in display is more suppressed than in the conventional driving method.

[2-6. Suppression of Fluctuations of Vgs in Upper Edge Portion of Panel]

As illustrated in FIG. 9, in the uppermost pixel row in the upper edge portion of the display panel, the cathode potential Vcat changes abruptly to a potential corresponding to the initialization voltage Vini in the initialization period b by the application of the initialization voltage Vini to the source electrode of the driving transistor 202.

The cathode potential Vcat then increases as the period transitions from the initialization completion time ta to the Vth detection period c, and the drain current of the driving transistor 202 flows and the source potential of the driving transistor 202 changes while no current flows through the organic EL element 201. Thereafter, the flow of the drain current stops at the end of the Vth detection period, and the cathode potential Vcat decreases slowly as the period transitions from the period d through the period e, the writing period f, and the period g to the black insertion period h.

After this, in the uppermost pixel row, the light emission period enters the display area from the blanking rows, while the period transitions from the write completion time to the light emission period j. Due to this entry of the light emission period from the virtual area to the display area, the drain current of the driving transistor 202 causes an abrupt flow of current into the organic EL element 201. Accordingly, the cathode potential Vcat starts an abrupt voltage rise.

Here, in the pixels in the uppermost row, the cathode potential Vcat at the write completion time decreases from its value at the initialization completion time, and accordingly Vgs increases. In the driving method according to the present embodiment, a row in which an increase in Vgs becomes a maximum in the upper edge portion of the display panel is shifted inward (downward) by providing the black insertion period h. In this case, the range of fluctuations of the cathode potential Vcat is suppressed by the amount of the inward (downward) shift of the pixel row from the uppermost row. Accordingly, a decrease in Vgs is more suppressed than in the conventional driving method.

On the other hand, the fluctuations of the cathode potential Vcat in a pixel row that is located a predetermined number of pixel rows inward of (below) the upper edge of the display panel reflect the fluctuations of the cathode potential Vcat in the uppermost pixel row located in close proximity. At this time, the initialization completion time ta and the write completion time tb in the pixel row located a predetermined number of pixel rows inward (downward) are shifted to the right by the row-by-row sequential scanning starting from the uppermost row. As a result, a predetermined pixel row whose initialization completion time ta coincides with a minimum point of Vcat generated at the write completion time tb in the uppermost row exists in the vicinity of the upper edge of the panel. In the driving method according to the present embodiment, the predetermined pixel row whose initialization completion time ta coincides with the above minimum point is shifted more inward (downward) than in the conventional driving method by providing the black insertion period h. In this case, while in the predetermined pixel row, the cathode potential Vcat at the write completion time tb decreases from its value at the initialization completion time ta, and accordingly Vgs increases, this pixel row is shifted more inward (downward) than in the conventional driving method. Thus, the fluctuations of the cathode potential Vcat are transmitted with attenuation. This suppresses a decrease in Vcat and accordingly suppresses an increase in Vgs.

Due to the above fluctuations of the cathode potential Vcat and the gate-source voltage Vgs of the driving transistor 202 in the upper edge portion of the panel, pixel rows in the vicinity of the uppermost row make a light zone along with an increase in Vgs at the time of light emission, and the above predetermined pixel row makes a dark zone along with a decrease in Vgs at the time of light emission. However, in the driving method according to the present embodiment, a difference in luminance between the aforementioned light and dark zones in the upper edge portion of the display panel is more suppressed and accordingly unevenness in display is more suppressed than in the conventional driving method.

[2-7. Advantageous Effects]

Figure 11A:
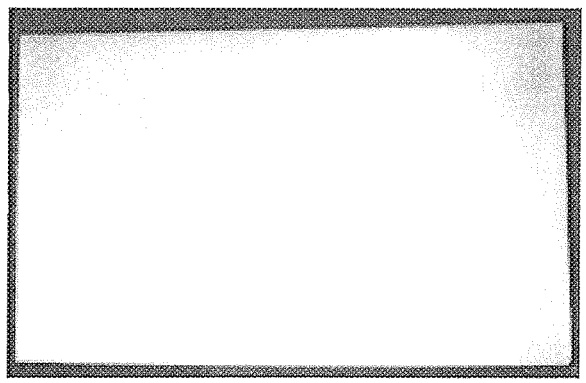
FIG. 11A illustrates an image displayed on the display device according to an embodiment.
Figure 11B:
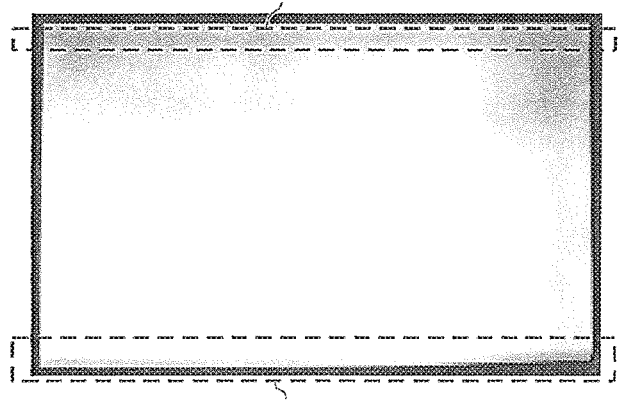
FIG. 11B illustrates an image displayed on a conventional display device.

FIG. 11A illustrates an image displayed on the display device according to the embodiment. FIG. 11B illustrates an image displayed on a conventional display device. A comparison of FIGS. 11A and 11B shows that the display device according to the present embodiment reduces the areas of dark zones in the upper and lower edge portions, whereas the conventional display device displays clearly observable dark zones in the upper and lower edge portions of the panel.

In the display device 1 that (1) includes the functional layer MO between the auxiliary line 131 and the transparent cathode 127 in the connection unit 20C, (2) has all pixels connected to one another through the transparent cathode 127, and (3) is driven by the progressive driving method that includes the blanking period, the cathode potentials Vcat in the pixels in the uppermost row fluctuate greatly due to the entry of the uppermost row of the display panel from the blanking period to the light emission period, and accordingly Vgs of the driving transistor 202 fluctuates. The gate-source voltage Vgs also fluctuates in the pixel row (pixel row shifted inward by a predetermined number of pixel rows) whose writing period coincides with the timing of fluctuations of the cathode potential Vcat in the uppermost row. Here, unevenness in display such as light and dark zones in the upper edge portion of the display panel occurs when Vgs in the uppermost pixel row and Vgs in the pixel row shifted inward by a predetermined number of pixel rows fluctuate in mutually opposite directions.

In contrast, in the display device or the method for driving a display device according to the present embodiment, in order to reduce the above unevenness in display, the control circuit 60 executes an initialization step of initializing the organic EL element 201, the driving transistor 202, and the capacitive element 210, a writing step of writing a signal voltage to the capacitive element 210, after the initialization step, a black insertion step of displaying, after the writing step, a black display without causing the organic EL element 201 to emit light during the black insertion period (first period) that is determined based on the resistance value of the transparent cathode 127, and a light emission step of causing the organic EL element 201 to emit light after the black insertion step.

According to this device or method, since the black insertion period is provided in accordance with the resistance value of the transparent cathode 127, a pixel row whose period from the initialization completion timing to the write timing coincides with the timing of fluctuations of the cathode potential Vcat generated in the pixels in the uppermost row what the time of entry of the light emission period from the blanking rows to the display area can be shifted more inward (downward). Accordingly, the fluctuations of Vgs will occur in pixel rows in which the fluctuations of the cathode potential Vcat are more attenuated. It is thus possible to suppress time-varying fluctuations of Vgs and to reduce unevenness in display such as light and dark zones in the upper edge portion of the display unit, caused by the time-varying fluctuations, without requiring a high-precision mask for film deposition and a complicated manufacturing step such as an alignment step.

In the display device or the method for driving a display device according to the present embodiment, in order to reduce the above unevenness in display, the control circuit 60 performs an initialization step of initializing the organic EL element 201, the driving transistor 202, and the capacitive element 210 during the initialization period (second period) that is determined based on the resistance value of the transparent cathode 127, a writing step of writing a signal voltage to the capacitive element 210 after the initialization step, and a light emission step of causing the organic EL element 201 to emit light after the writing step.

According to this device or method, since the initialization period is provided in accordance with the resistance value of the transparent cathode 127, a pixel row whose period from the initialization completion timing to the write timing coincides with the timing of fluctuations of the cathode potential Vcat generated in the pixels in the lowermost row at the time of exit of the initialization period from the display area into the blanking rows can be shifted more inward (upward). Accordingly, the fluctuations of Vgs will occur in pixel rows in which the fluctuations of the cathode potential Vcat are more attenuated. It is thus possible to suppress time-varying fluctuations of Vgs and to reduce unevenness in display such as light and dark zones in the lower edge portion of the display unit, caused by the time-varying fluctuations, In the display device or the method for driving a display device according to the present embodiment, in order to reduce the above unevenness in display, the control circuit 60 executes an initialization step of initializing the organic EL element 201, the driving transistor 202, and the capacitive element 210 during the initialization period (second period) that is determined based on the resistance value of the transparent cathode 127, a writing step of writing a signal voltage to the capacitive element 210 after the initialization step, a black insertion step of displaying, after the writing step, a black display without causing the organic EL element 201 to emit light during the black insertion period (first period) that is determined based on the resistance value of the transparent cathode 127, and a light emission step of causing the organic EL element 201 to emit light after the black insertion step.

According to this device or method, since the initialization period is provided in accordance with the resistance value of the transparent cathode 127, a pixel row whose period from the initialization completion timing to the write timing coincides with the timing of fluctuations of the cathode potential Vcat generated in the pixels in the lowermost row at the time of exit of the initialization period from the display area into the blanking rows can be shifted more inward (upward). In addition, since the black insertion period is provided in accordance with the resistance value of the transparent cathode 127, a pixel row whose period from the initialization completion timing to the write timing coincides with the timing of fluctuations of the cathode potential Vcat generated in the pixels in the uppermost row at the time of entry of the light emission period from the blanking rows to the display area can be shifted more inward (downward). It is thus possible to suppress time-varying fluctuations of Vgs and to reduce unevenness in display such as light and dark zones in both of the upper and lower edge portions of the display unit, caused by the time-varying fluctuations.

[2-8. Sheet Resistance of Transparent Cathode]

Figure 12:
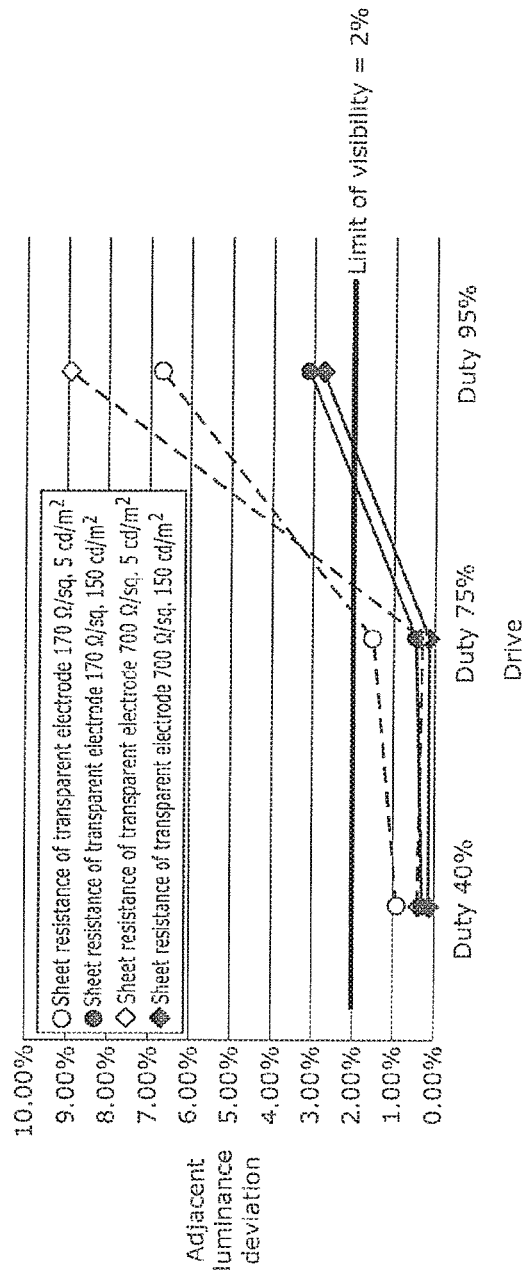
FIG. 12 is a graph illustrating the relationship between a light-emission duty ratio and unevenness in display.

FIG. 12 is a graph illustrating the relationship between the light-emission duty ratio and the unevenness in display. In the graph of FIG. 12, the horizontal axis indicates the light-emission duty ratio, and the vertical axis indicates the adjacent luminance deviation. In the driving method according to the present embodiment, the black insertion period is provided in order to suppress unevenness in display in the upper edge portion of the display panel, and the initialization period is set long in order to suppress unevenness in display in the lower edge portion of the display panel. According to the driving method of the present embodiment, the light-emission duty ratio decreases because the black insertion period and the initialization period are both non-light emission periods. In FIG. 12, when the light-emission duty ratio is set to 95% in the conventional driving method, the adjacent luminance deviation exceeds the limit of visibility, i.e., 2%, that is a threshold value at which unevenness in display becomes detectable.

In contrast, when the light-emission duty ratio is set to 75% or 40% in the driving method according to the present embodiment, the adjacent luminance deviation is less than or equal to the limit of visibility, i.e., 2%.

The graph shows that when the sheet resistance of the transparent cathode 127 is 700 Ω/sq., the adjacent luminance deviation considerably falls below the limit of visibility, i.e., 2% by setting the light-emission duty ratio to 75%, as compared with the case where the sheet resistance of the transparent cathode 127 is 170 Ω/sq.

On the other hand, when the sheet resistance of the transparent cathode 127 is 170 Ω/sq., the adjacent luminance deviation can be reduced by setting the light-emission duty ratio to a lower value (40%).

That is, the control circuit 60 sets the black insertion period shorter (increases the light-emission duty ratio) as the resistance value of the transparent cathode 127 increases, and displays a black display without causing the organic EL element 201 to emit light during the black insertion period.

Figure 13A:
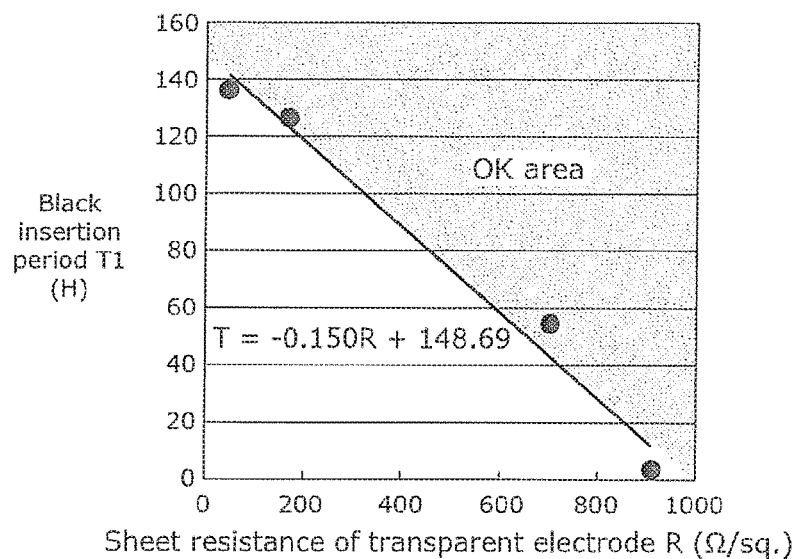
FIG. 13A is a graph illustrating the relationship between the sheet resistance of a transparent cathode and a black insertion period in the method for driving a display device according to an embodiment.
Figure 13B:
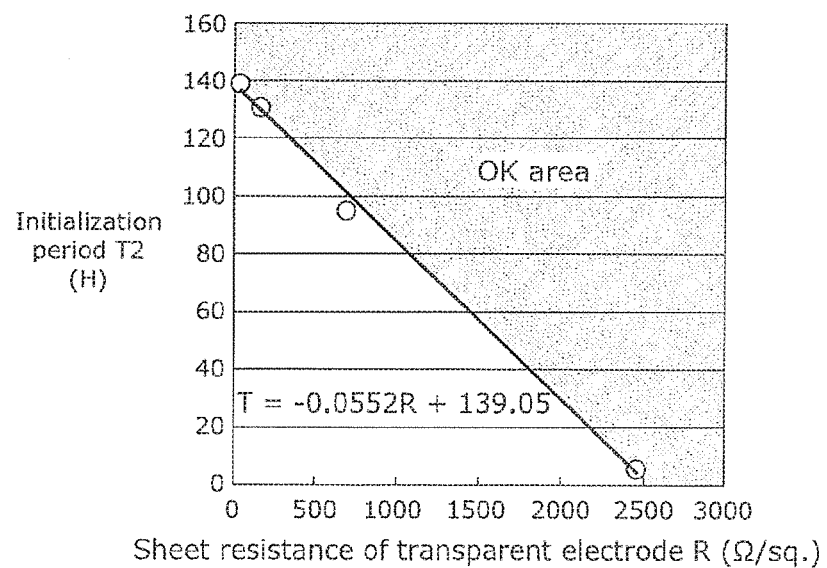
FIG. 13B is a graph illustrating the relationship between the sheet resistance of the transparent cathode and an initialization period in the method for driving a display device according to an embodiment.

FIG. 13A is a graph illustrating the relationship between the sheet resistance of the transparent cathode and the black insertion period in the method for driving a display device according to an embodiment. FIG. 13B is a graph illustrating the relationship between the sheet resistance of the transparent cathode and the initialization period in the method for driving a display device according to an embodiment. In FIG. 13A, the horizontal axis indicates the sheet resistance R (Ω/sq.) of the transparent cathode 127, and the vertical axis indicates the black insertion period (H). In FIG. 13B, the horizontal axis indicates the sheet resistance R (Ω/sq.) of the transparent cathode 127, and the vertical axis indicates the initialization period (H). Reference character H represents a unit where 1H is a unit horizontal scanning period in row-by-row sequential scanning.

In FIGS. 13A and 13B, straight lines that connect measurement points indicate that the density (contrast) Cjnd of unevenness at the limit of detectivity is 3.39%, and Formulas 1 and 2 are obtained, where R is the sheet resistance of the transparent cathode 127, T1 (H) is the black insertion period, and T2 (H) is the initialization period.

$$T1 = -0.150R + 148.69 \qquad \text{(Formula 1)}$$

$$T2 = -0.0552R + 139.05 \qquad \text{(Formula 2)}$$

Here, Cjnd is expressed as a function of the limit of the area of unevenness Sjnd (mm²) by Formula 3.

$$C_{jnd} = 1.97\left(\frac{1}{S_{jnd}^{0.33}}\right) + 0.72 \qquad \text{(Formula 3)}$$

When a 55-inch 4K panel, for example, is assumed in the present embodiment, the size of one pixel is 0.315 mm. In this case, if the magnitude of unevenness is recognizable by the difference in luminance between adjacent rows, Sjnd corresponds to two pixels, i.e., $(0.315 \text{ mm} \times 2)^2 = 0.3969$ mm². Substituting this Sjnd value into Formula 3 gives Cjnd of 3.39%

That is, the control circuit 60 determines the black insertion period so as to satisfy:

$$T1 \geq -0.150R + 148.69 \qquad \text{(Formula 4)}$$

In this case, the black insertion period is set by an indicator that is defined by the limit of human sensitivity to unevenness, and accordingly unevenness in display can be reduced with high precision.

The control circuit 60 also determines the initialization period so as to satisfy:

$$T2 \geq -0.0552R + 139.05 \qquad \text{(Formula 5)}$$

In this case, the initialization period is set by an indicator that is defined by the limit of human sensitivity to unevenness, and accordingly unevenness in display can be reduced with high precision.

OTHER EMBODIMENTS

While the above has been a description of embodiments of the display device and the method for driving a display device according to the present invention, the display device and the method for driving a display device according to the present invention are not limited to the embodiments described above. The present invention also includes other embodiments implemented by any combination of constituent elements described in the embodiments, variations obtained by making various modifications conceivable by those skilled in the art to the embodiments without departing from the scope of the present invention, and various devices that incorporate the display device according to the embodiments.

For example, in the above embodiments, the setting of the black insertion period on the basis of the resistance value of the transparent cathode 127 is given as an example of the configuration for reducing unevenness in display in the upper edge portion of the display panel, and the setting of the initialization period on the basis of the resistance value of the transparent cathode 127 is given as an example of the configuration for reducing unevenness in display in the lower edge portion of the display panel. However, the display device and the method for driving a display device according to the present invention are not limited to this example, and may include only the configuration for reducing unevenness in display in the upper edge portion of the display panel. That is, only the black insertion period may be set on the basis of the resistance value of the transparent cathode 127.

In this case, the light emission timing in the uppermost row is caused to coincide with the write timing in a pixel row inside the panel where the fluctuations of the cathode potential are attenuated. Accordingly, it is possible to suppress unevenness in display such as lightness and darkness in the upper edge portion of the panel.

Alternatively, the display device and the method for driving a display device according to the present invention may include only the configuration for reducing unevenness in display in the lower edge portion of the display panel. That is, only the initialization period may be set on the basis of the resistance value of the transparent cathode 127.

In this case, the initialization timing in the lowermost row is caused to coincide with the write timing in a pixel row inside the panel where the fluctuations of the cathode potential are attenuated. Accordingly, it is possible to suppress unevenness in display such as lightness and darkness in the lower edge portion of the panel.

While the above description take an example of the case where the organic EL layer 12 is configured by the anode, the hole injection layer, the hole transfer layer, the organic light emitting layer, the electron transfer layer, and the cathode, the present invention is not limited to this example. For example, the organic EL layer may be configured to include at least an organic light emitting layer, an anode, and a cathode. As another alternative, the organic EL layer may be configured to include at least one of the hole injection layer, the hole transfer layer, the electron transfer layer, and the electron injection layer, in addition to the organic light emitting layer, the anode, and the cathode.

While the above-described embodiments take the example of a configuration for reducing unevenness in display caused by the fluctuations of the potential of the transparent cathode 127 that is formed continuously in the display unit 2, the present invention also includes a configuration for reducing unevenness in display caused by the fluctuations of the potential of the anode 121, for example in an anode-common top-emission structure, using the circuit configuration, the light emitting method, and the stacked structure of the organic EL layer.

While the above embodiments describe the configuration of the pixel 20 that includes three sub-pixels 20R, 20G, and 20B, the pixel configuration is not limited to this example. For example, effects similar to those of the display device 1 according to the above-described embodiments will also be achieved even if the pixel 20 is configured by one pixel without including a plurality of sub-pixels.

While the above embodiments describe the intermediate layer that is part of the layer forming the light emitting unit, the intermediate layer constituting the connection unit does not necessarily have to be continuous with the layer constituting the light emitting unit. The intermediate layer may be a layer that can separate the light emitting unit and the connection unit without using a high-precision mask and, for example, may be a layer that can separate the light emitting unit and the connection unit by the banks 122 in the stage of film deposition. Even in this case, it is possible to reduce fluctuations in luminance while simplifying the manufacturing process.

Figure 14:
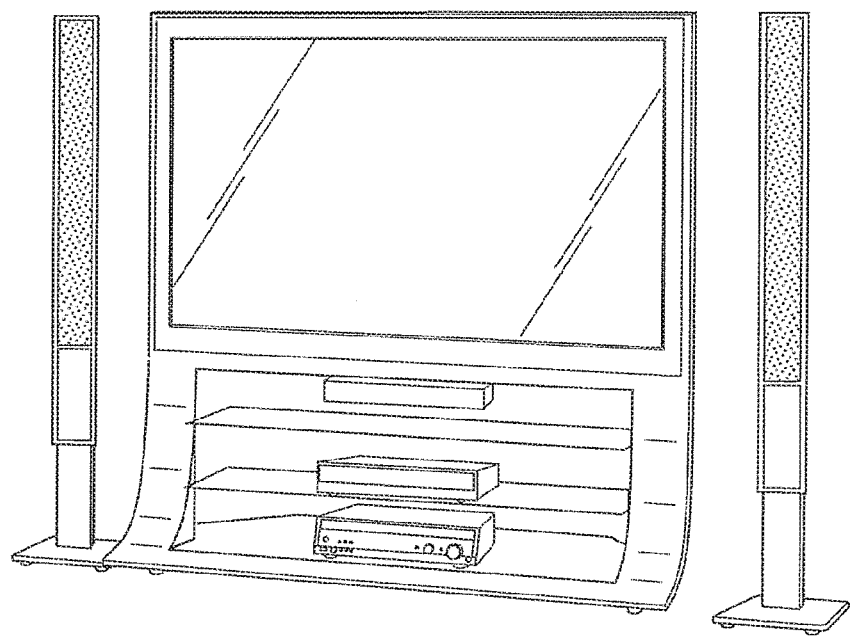
FIG. 14 is an external view of a low-profile, flat TV with a built-in display device according to an embodiment.

The display device 1 according to the present embodiment may be built in a low-profile, flat TV as illustrated in FIG. 14. The display device 1 according to the present embodiment will help implement a high-quality low-profile, flat TV that considerably reduces fluctuations in luminance while simplifying the manufacturing process.

The control circuit 60 included in the display device 1 according to the above-described embodiments is typically implemented as an LSI, which is an integration circuit. Part of the control circuit 60 included in the display device 1 may be implemented by a dedicated circuit or a general-purpose processor. The control circuit 60 may also be implemented by a field programmable gate array that is programmable after the manufacture of the LSI, or by a reconfigurable processor that is capable of reconfiguring connections and settings of circuit cells inside the LSI.

The present invention may be a computer program that implements the method for driving a display device with a computer, or may be digital signals of the above computer program.

The present invention may be implemented by recording the above computer program or the above digital signals to a non-transitory computer-readable recording medium such as a flexible disc, a hard disk, a CD-ROM, an MO, a DVD, a DVD-ROM, a DVD-RAM, a Blu-ray Disc (BD: registered trademark), or a semiconductor memory. The present invention may be the above digital signals recorded to such a non-transitory recording medium.

The present invention may be implemented by transmitting the above computer program or the above digital signals via, for example, telecommunication lines, wireless or wired communication lines, networks typically represented by the Internet, or data broadcasting.

The present invention may be a computer system that includes a microprocessor and a memory, the memory storing the above computer program, and the microprocessor operating in accordance with the above computer program.

The present invention may also be implemented by other independent computer systems by recording the above program or the above digital signals to the above non-transitory recording medium and transferring them or by transmitting the above program or the above digital signals via the above network or other means.

INDUSTRIAL APPLICABILITY

The present invention is useful for organic EL flat panel displays and is suited to be used as a display that requires uniform image quality.

The invention claimed is:

1. A method for driving a display device that includes a display unit and is driven by a sequence of row-by-row sequential scanning that includes a vertical blanking period, the display unit having pixels arranged in rows and columns, each of the pixels including a first electrode formed on a drive circuit substrate on which a circuit element is formed, a light emitting layer formed above the first electrode and including a light emitting substance, and a second electrode formed above the light emitting layer,
the method comprising:
initializing a light emitting element and the circuit element;
writing a signal voltage to the circuit element after the initializing;
inserting, after the writing, a black display to display the black display without causing the light emitting element to emit light during a first period that is determined based on a resistance value of the second electrode; and
causing the light emitting element to emit light after the inserting.

2. The method for driving a display device according to claim 1,
wherein, in the inserting, the first period is set shorter as the resistance value of the second electrode increases, when the black display is displayed without the light emitting element being caused to emit light.

3. The method for driving a display device according to claim 1,
wherein, in the inserting, the first period is determined to satisfy a relation of:

$$T1 \geq -0.150R + 148.69$$

where R (Ω/sq.) is a sheet resistance of the second electrode, 1H is a unit horizontal scanning period in the row-by-row sequential scanning, and T1 (H) is the first period.

4. The method for driving a display device according to claim 1,
wherein, in the light emitting, potentials of the second electrodes of pixels in an uppermost row of the display unit fluctuate at a light-emission start timing in the uppermost row of the display unit, and
in the initializing, an initialization completion timing in a pixel row that is located a predetermined number of pixel rows below the uppermost row of the display unit coincides with the light-emission start timing in the uppermost row of the display unit.

5. The method for driving a display device according to claim 1,
wherein the initializing is implemented during a second period that is determined based on a resistance value of the second electrode.

6. The method for driving a display device according to claim 5,
wherein the initializing is implemented while the second period is set shorter as the resistance value of the second electrode increases.

7. The method for driving a display device according to claim 5,
wherein, in the initializing, the second period is determined to satisfy a relation of:

$$T2 \geq -0.0552R + 139.05$$

where R (Ω/sq.) is a sheet resistance of the second electrode, 1H is a unit horizontal scanning period in the row-by-row sequential scanning, and T2 (H) is the second period.

8. A method for driving a display device that includes a display unit and is driven by a sequence of row-by-row sequential scanning that includes a vertical blanking period, the display unit having pixels arranged in rows and columns, each of the pixels including a first electrode formed on a drive circuit substrate on which a circuit element is formed, a light emitting layer formed above the first electrode and including a light emitting substance, and a second electrode formed above the light emitting layer,
the method comprising:
initializing a light emitting element and the circuit element during a second period that is determined based on a resistance value of the second electrode;
writing a signal voltage to the circuit element after the initializing; and
causing the light emitting element to emit light after the writing.

9. The method for driving a display device according to claim 8, wherein, in the initializing, the light emitting element and the circuit element are initialized while the second period is set shorter as the resistance value of the second electrode increases.

10. The method for driving display device according to claim 8,
wherein, in the initializing, the second period is determined to satisfy a relation of:

$$T2 \geq -0.0552R + 139.05$$

where R (Ω/sq.) is a sheet resistance of the second electrode, 1H is a unit horizontal scanning period in the row-by-row sequential scanning, and T2 (H) is the second period.

11. The method for driving a display device according to claim 8,
wherein, in the initializing, potentials of the second electrodes of pixels in a lowermost row of the display unit fluctuate at an initialization timing in the lowermost row of the display unit, and
in the writing, a write completion timing in a pixel row that is located a predetermined number of pixel rows above the lowermost row of the display unit coincides with the initialization timing in the lowermost row of the display unit.

12. A display device comprising a display unit and being driven by a sequence of row-by-row sequential scanning that includes a vertical blanking period, the display unit having pixels arranged in rows and columns, each of the pixels including a light emitting element and a circuit element for driving light emission of the light emitting element,
the pixel including:
a first electrode formed on a drive circuit substrate on which the circuit element is formed;
a light emitting layer formed above the first electrode and including a light emitting substance; and
a second electrode formed above the light emitting layer, the display device further comprising
a control unit configured to execute:
applying an initialization voltage to the first electrode;
writing a signal voltage to the circuit element after the initializing;
inserting, after the writing, a black display to display the black display without causing the light emitting element to emit light during a first period that is determined based on a resistance value of the second electrode; and
causing the light emitting element to emit light after the inserting.

13. The display device according to claim 12,
wherein the pixel further includes:
an auxiliary line formed on the drive circuit substrate and spaced from the first electrode; and
an intermediate layer disposed between the first electrode and the second electrode, and
the intermediate layer and the second electrode extend from above the first electrode to above the auxiliary line.

14. The display device according to claim 12,
wherein the control unit is configured to, in the inserting, determine the first period to satisfy a relation:

$$T1 \geq -0.150R + 148.69$$

where R (Ω/sq.) is a sheet resistance of the second electrode, 1H is a unit horizontal scanning period in the row-by-row sequential scanning, and T1 (H) is the first period.

15. The display device according to claim 12,
wherein the control unit is configured to implement the initializing during a second period that is determined based on a resistance value of the second electrode.

16. The display device according to claim 15,
wherein the control unit is configured to, in the initializing, determine the second period to satisfy a relation of:

$$T2 \geq -0.0552R + 139.05$$

where R (Ω/sq.) is a sheet resistance of the second electrode, 1H is a unit horizontal scanning period in the row-by-row sequential scanning, and T2 (H) is the second period.

17. A display device comprising a display unit and being driven by a sequence of row-by-row sequential scanning that includes a vertical blanking period, the display unit having pixels arranged in rows and columns, each of the pixels including a light emitting element and a circuit element for driving light emission of the light emitting element,
the pixel including:
a first electrode formed on a drive circuit substrate on which the circuit element is formed;
a light emitting layer formed above the first electrode and including a light emitting substance; and
a second electrode formed above the light emitting layer, the display device further comprising
a control unit configured to execute:
applying an initialization voltage to the first electrode during a second period that is determined based on a resistance value of the second electrode;
writing a signal voltage to the circuit element after the initializing; and
causing the light emitting element to emit light after the writing.

18. The display device according to claim 17,
wherein the pixel further includes:
an auxiliary line formed on the drive circuit substrate and spaced from the first electrode; and
an intermediate layer disposed between the first electrode and the second electrode, and
the intermediate layer and the second electrode extend from above the first electrode to above the auxiliary line.

19. The display device according to claim 17,
wherein the control unit is configured to, in the initializing, determine the second period to satisfy a relation of:

$$T2 \geq -0.0552R + 139.05$$

where R (Ω/sq.) is a sheet resistance of the second electrode, 1H is a unit horizontal scanning period in the row-by-row sequential scanning, and T2 (H) is the second period.

* * * * *